United States Patent
Schulze et al.

(10) Patent No.: US 10,566,462 B2
(45) Date of Patent: Feb. 18, 2020

(54) BIPOLAR SEMICONDUCTOR DEVICE AND MANUFACTURING METHOD

(75) Inventors: Hans-Joachim Schulze, Taufkirchen (DE); Frank Pfirsch, Munich (DE); Franz-Josef Niedernostheide, Muenster (DE)

(73) Assignee: Infineon Technologies Austria AG, Villach (AT)

(*) Notice: Subject to any disclaimer, the term of this patent is extended or adjusted under 35 U.S.C. 154(b) by 1017 days.

(21) Appl. No.: 12/512,285

(22) Filed: Jul. 30, 2009

(65) Prior Publication Data
US 2011/0024791 A1 Feb. 3, 2011

(51) Int. Cl.
*H01L 29/861* (2006.01)
(52) U.S. Cl.
CPC .................. *H01L 29/861* (2013.01)
(58) Field of Classification Search
USPC ... 257/109, 155, E21.35, E21.351, E21.352, 257/E29.171
See application file for complete search history.

(56) References Cited

U.S. PATENT DOCUMENTS

| | | | |
|---|---|---|---|
| 5,063,428 A | 11/1991 | Schlangenotto et al. | |
| 6,803,627 B2* | 10/2004 | Pfirsch | H01L 29/0634 257/129 |
| 7,078,781 B2* | 7/2006 | Hatakeyama et al. | 257/472 |
| 7,304,356 B2* | 12/2007 | Takahashi | 257/401 |
| 2003/0178672 A1* | 9/2003 | Hatakeyama | H01L 29/0615 257/328 |
| 2004/0173820 A1* | 9/2004 | Kinoshita | H01L 29/0619 257/200 |
| 2005/0189564 A1* | 9/2005 | Jensen | H01L 27/0255 257/197 |
| 2007/0029634 A1 | 2/2007 | Schulze et al. | |
| 2007/0114607 A1* | 5/2007 | Pendharkar | 257/343 |
| 2015/0321572 A1* | 11/2015 | Koch | G01R 31/3648 701/22 |

FOREIGN PATENT DOCUMENTS

DE 44 38 896 5/1996
WO 2009148695 12/2009

* cited by examiner

*Primary Examiner* — Kenneth Parker
*Assistant Examiner* — Christopher A Culbert
(74) *Attorney, Agent, or Firm* — Dicke, Billig & Czaja, PLLC

(57) ABSTRACT

A bipolar semiconductor device and method are provided. One embodiment provides a bipolar semiconductor device including a first semiconductor region of a first conductivity type having a first doping concentration, a second semiconductor region of a second conductivity type forming a pn-junction with the first semiconductor region, and a plurality of third semiconductor regions of the first conductivity type at least partially arranged in the first semiconductor region and having a doping concentration which is higher than the first doping concentration. Each of the third semiconductor regions is provided with at least one respective junction termination structure.

32 Claims, 20 Drawing Sheets

BIPOLAR SEMICONDUCTOR DEVICE AND MANUFACTURING METHOD

BACKGROUND

This specification refers to bipolar semiconductor devices, in one embodiment to speed diodes and a manufacturing method therefor.

Diode structures are desired to have a very good surge current strength and also a sufficient dynamic robustness. Moreover, the losses occurring during operation are to be kept small. For this purpose, CAL diodes (CAL=Controlled Axial Lifetime) and EMCON diodes (EMCON=Emitter Controlled) have been developed. In the case of CAL diodes, a heavily doped p-type emitter is used. However, manufacturing of CAL diodes requires intensive helium irradiation and further methods for reducing the charge carrier lifetime in order that the turn-off losses do not become too high. EMCON diodes, by contrast, have a relatively weakly p-doped emitter. However, a reduced surge current strength is observed in this case.

A further diode variant is the "speed diode" (self-adjusted p-emitter efficiency diode). While the forward current of this diode flows via a weakly p-doped zone during normal operation, in the surge current case charge carriers are injected from highly p-doped zones and contribute to a high surge current strength and surge energy capacity, respectively. However, the dynamic robustness of the known speed diode is often unsatisfactory.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
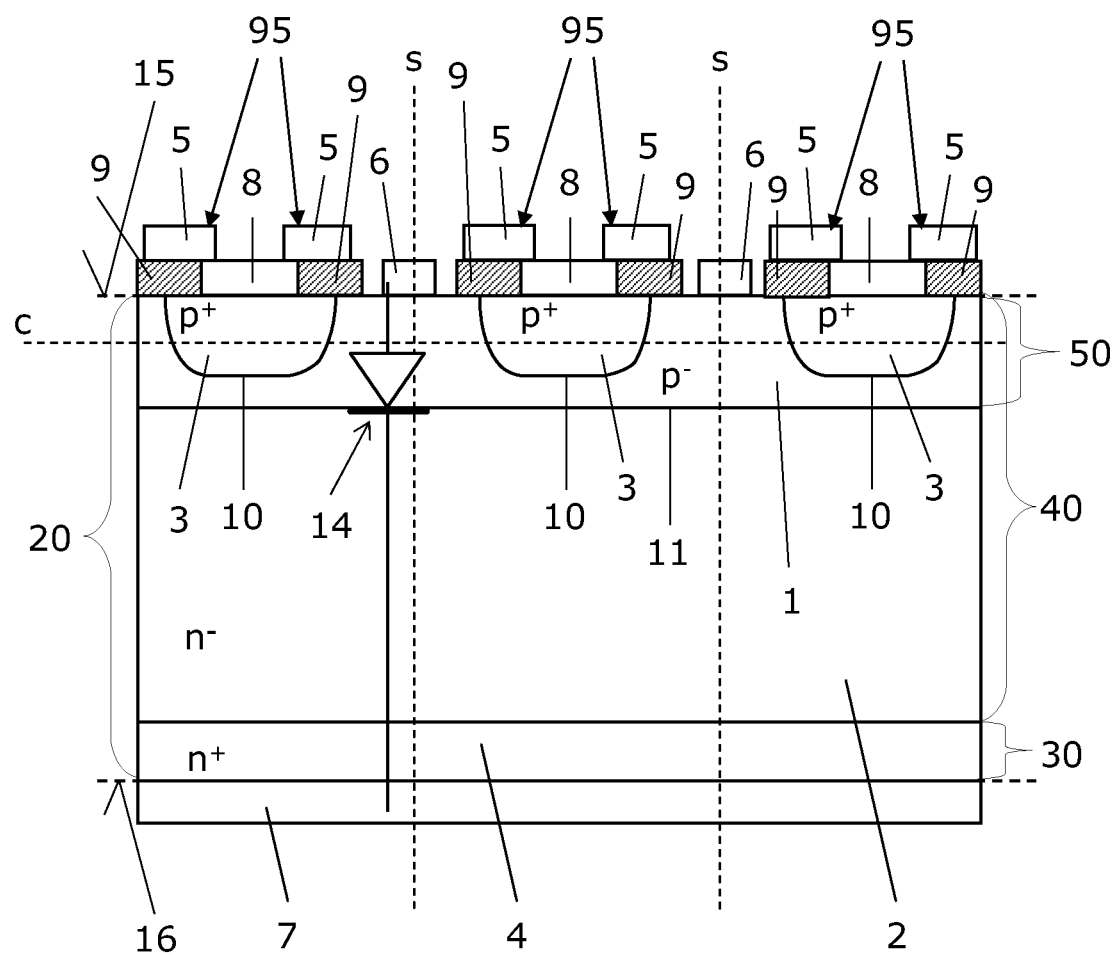
FIG. 1 illustrates a vertical cross-section of a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims.

The terms "lateral" and "horizontal" as used in this specification intend to describe an orientation parallel to a first surface of a semiconductor substrate or body. This can be for instance the surface of a wafer or a die.

The term "vertical" as used in this specification intends to describe an orientation which is arranged perpendicular to, i.e. in normal direction of, the first surface of the semiconductor substrate or body.

In this specification, p-doped is referred to as first conductivity type while n-doped is referred to as second conductivity type. It goes without saying that the semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. Indicating the relative doping concentration does not, however, mean that doping regions of the same relative doping concentration have to have the same absolute doping concentration unless otherwise stated. For example, two different n⁺ regions can have different absolute doping concentrations. The same applies, for example, to an n⁺ and a p⁺ region.

Specific embodiments described in this specification pertain to, without being limited thereto, bipolar power semiconductor devices including a diode structure having a load pn-junction which is forwardly biased when a forward current flows through the diode structure. The term "bipolar semiconductor device" as used in this specification intends to describe a semiconductor device in which the forward current is a bipolar current flow. Examples of bipolar semiconductor devices include, diodes, thyristors and IGBTs.

According to one embodiment, a bipolar semiconductor device is provided. The semiconductor device includes a first semiconductor region of a first conductivity type having a first doping concentration, a second semiconductor region of a second conductivity type forming a pn-junction with the first semiconductor region, and a plurality of third semiconductor regions 3 each of which is provided with at least one respective junction termination structure.

According to another embodiment, a method for manufacturing a bipolar semiconductor device is provided. The method includes providing a semiconductor substrate including a first semiconductor region of a first conductivity type having a first doping concentration and a second semiconductor region of the second conductivity type. The first semiconductor region and the second semiconductor region form a pn-junction. The method further includes forming a plurality of third semiconductor regions of the first conductivity type having a third doping concentration which is higher than the first doping concentration such that each of the plurality of third semiconductor regions is at least partially arranged in the first semiconductor region. Furthermore, the method includes forming a plurality of junction termination structures such that each of the third semiconductor regions is provided with at least one respective junction termination structure.

FIG. 1 illustrates, in a vertical cross-section, one embodiment of a semiconductor device 100 which is a power semiconductor device. The semiconductor device 100 includes a semiconductor substrate 20 having a first surface 15 and a second surface 16 arranged opposite to the first surface 15. The semiconductor substrate 20 can be made of any semiconductor material suitable for manufacturing a semiconductor device. Examples of such materials include, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaP) or indium gallium arsenide phosphide (In—GaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, silicon-silicon carbide ($Si_xC_{1-x}$) and SiGe heterojunction semiconductor material. For power semiconductor applications currently mainly Si, SiC and GaN materials are used.

Semiconductor substrate 20 can be a single bulk mono-crystalline material. It is also possible, that the semiconductor substrate 20 includes a bulk mono-crystalline material 30 and at least one epitaxial layer 40 formed thereon. In one or more embodiments, using epitaxial layers 40 provides more freedom in tailoring the background doping of the material since the doping concentration can be adjusted during deposition of the epitaxial layer or layers.

Typically, the semiconductor substrate 20 is formed by providing a single bulk mono-crystalline body 30 of a second conductivity type (n-type) on which one or more single-crystalline layers 40 are deposited epitaxially. The body 30 may form a highly doped n-type fourth semiconductor region 4 or contact region 4. The epitaxial layer or layers 40 accommodates or accommodate a p-type first semiconductor region 1, an n-type second semiconductor region 2, and a plurality of p-type third semiconductor regions 3 or wells 3 which are partially arranged or completely embedded in the first semiconductor region 1. Junctions 10 are formed between the first semiconductor region 1 and each of the third semiconductor regions 3 having a higher doping concentration than the first semiconductor region 1. The term "junction" as used in this specification intends to describe the boundary surface or boundary layer between adjoining semiconductor regions or portions of the same conductivity type but having significantly different doping concentrations. Different thereto, the term "pn-junction" describes the interface between adjoining semiconductor regions of opposite doping type.

In some embodiments, the third semiconductor regions 3 are spaced from the second semiconductor region 2 by portions of the first semiconductor region 1 so that the third semiconductor regions 3 form respective junctions 10 only with the first semiconductor region 1. During epitaxial deposition, the desired doping concentration of the first and second semiconductor region 1 and 2 can be adjusted by supplying an appropriate amount of dopant. Different thereto, the third semiconductor regions 3 are typically formed in the epitaxially deposited semiconductor regions 1 by implantation and a subsequent drive-in process. It is also possible to form the first semiconductor region 1 by implantation. If desired, the manufacturing can include separate epitaxial deposition processes with different dopants of varying concentration or with the same dopant but with varying concentration to form the respective functional regions.

In other embodiments, a substrate wafer or die having the desired background doping concentration of the second semiconductor region 2 is provided. The first and third semiconductor regions 1 and 3 are formed by implantation at the first surface 15. This is typically followed by a high temperature process. If desired, the substrate wafer can be thinned at the second surface 16 and the fourth semiconductor region 4 is formed by implantation at the second surface 16 which is also typically followed by a high temperature process. It would also be possible to thin the substrate wafer before implanting the fourth semiconductor region 4, if such thinned wafers can reasonably be handled. By using this approach, an expensive epitaxial deposition is avoided.

The semiconductor device 100 of FIG. 1 further includes a first metallization 6 which forms an anode 6 in one embodiment and is arranged on, and in Ohmic contact with, the first semiconductor region 1 for electrically connecting the first semiconductor region 1. In the context of the present specification, the terms "in Ohmic contact", "in electric contact", "in contact" and "electrically connected" intend to describe that there is an Ohmic electric connection or Ohmic current path between two regions, portions or parts of a semiconductor devices, in one embodiment a connection of low Ohmic resistance, even if no voltages are applied to the semiconductor device. An Ohmic electric connection is characterized by a linear and symmetric current-voltage (I-V) curve different to, for example, the asymmetric current-voltage (I-V) curve of a pn-junction.

The second semiconductor region 2 forms a first pn-junction 11 with the first semiconductor region 1 so that any current flowing through the semiconductor device between the anode 6 and the second semiconductor region 2 has to flow across the first pn-junction 11. Typically, the second semiconductor region 2 is, in the illustrated section, spaced apart from the first metallization 6. The doping concentrations and geometries of the semiconductor regions are typically chosen such that the space charge region, which is formed when the rectifying pn-junction 11 is reversely biased with reverse voltages the semiconductor device 100 is designed for, does not reach the first surface 15 and the first metallization 6, respectively. Further, a fourth n-type semiconductor region 4 typically adjoins the second semiconductor region 2 and forms an Ohmic contact to a second metallization 7 which forms a cathode in this embodiment and is arranged on the second surface 16. Within the first semiconductor region 1 several spaced apart p-type third semiconductor regions 3 (e.g., illustrated as islands or wells) are arranged which in one embodiment extend to the first surface 15 and adjoin a third metallization 8 arranged on the the first surface 15. The third metallization 8 connects the third semiconductor regions 3 and is in one embodiment electrically connected with the first metallization 6 to form a common electrode, i.e. a common anode.

In some embodiments, the first and third metallization form a simply connected metallization. Further, the first and third metallization 6 and 8 may be formed from a single deposited layer or from two separately deposited layers.

Figure 2:
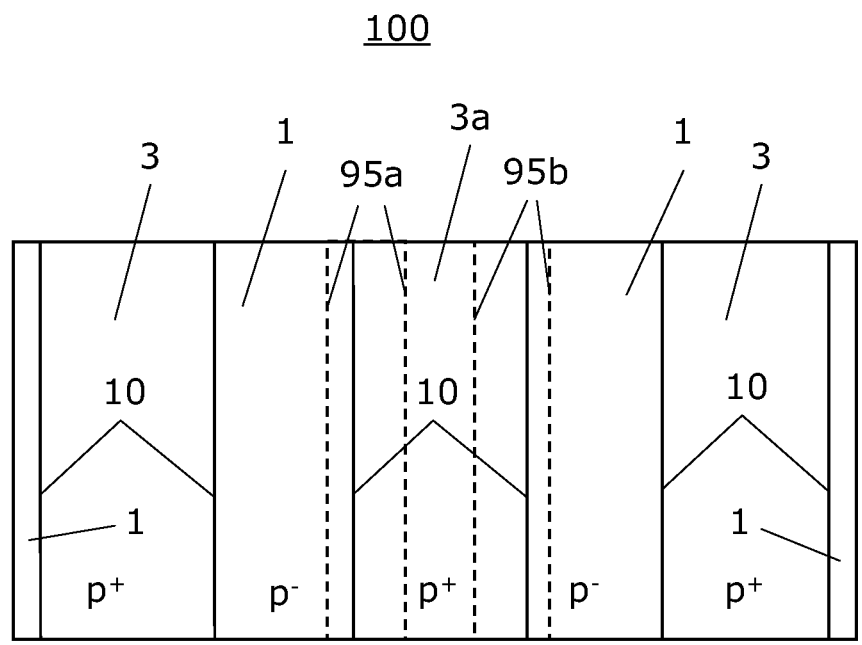
FIGS. 2A and 2B illustrate horizontal cross-sections of the semiconductor device of FIG. 1 according to one or more embodiments.
Figure 2:
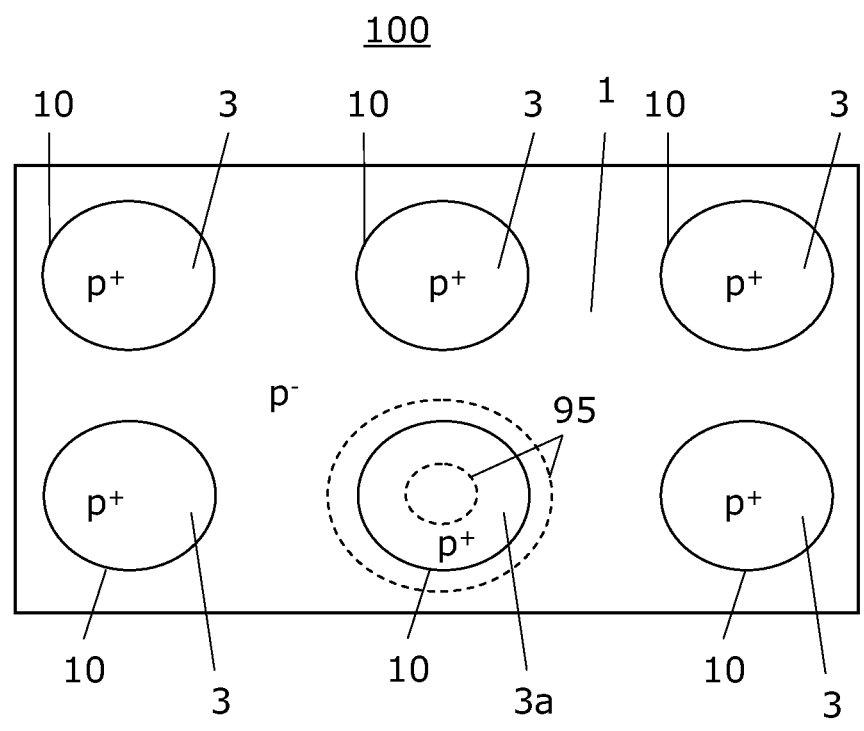

According to an embodiment, each of the third semiconductor regions 3 is provided with a respective field plate structure 95 arranged on the first surface 15. The field plate structures 95 are typically formed by an insulating region or insulating portion 9 which adjoins the first semiconductor region 1 and is arranged next to the respective third semiconductor region 3, and a field plate 5 in Ohmic connection to the third metallization 8, i.e. in Ohmic connection to the respective third semiconductor region 3, and arranged on the insulating region 9. In one or more embodiments, the insulating portions 9 also adjoin the respective third semiconductor region 3. In other words, the insulating portions 9 adjoin a respective junction 10 such that the field plate structure 95 maybe operated as a junction termination structure for the respective junction 10. The first semiconductor region 1 is electrically contacted between neighboring field plate structures 95 by the first metallization 6 which typically operates as a load current-carrying electrode. Each field plate structure may by simply connected or may include separate portions. This will be illustrated with reference to FIGS. 2A and 2B which correspond to typical horizontal cross-sections through the dashed line c of FIG. 1.

The junction termination structures are arranged at the periphery of a respective third semiconductor region 3 and extend in some embodiments laterally beyond the outer edge of the respective third semiconductor region 3 when seen in a cross-section.

According to the embodiment of FIG. 2A, the third semiconductor regions 3 are bar shaped when seen in a plan view. Accordingly, each field plate structure 95 includes two separated portions 95A and 95B as indicated by the dashed lines 95A and 95B for the third semiconductor region 3a. For clarity reasons, the separated portions 95A and 95B of the field plate structures 95 provided for the remaining third semiconductor regions 3 are not illustrated.

According to the embodiment illustrated in FIG. 2B, the field plate structures 95 are simply connected. Again, only the field plate structure 95 provided for the third semiconductor region 3a is illustrated as a dashed ring 95. The field plate structures of the remaining third semiconductor regions 3 are, for clarity reasons, not illustrated. Each field plate structure 95 adjoining and/or surrounding respective third semiconductor regions 3 and 3a, respectively, may be formed by a ring shaped or donut-shaped field plate adjoining a ring shaped or donut-shaped insulating portion. The third semiconductor regions 3 and 3a, respectively, may be formed as cylinders, half-spheres, half-ellipsoids or the like. The junctions 10 may, in a horizontal cross-section, also be shaped as a polygon. In this event, the field plate structures 95 typically also exhibit shapes with polygonal boundaries in a horizontal cross-section.

Referring again to FIG. 1, further embodiments are explained. The material of the anodes 6 and 8, the cathode 7 and the field plates 5 is typically a metal such as Al, Ti, W and Cu but may also be a material with metallic or near metallic properties with respect to electric conductivity such as heavily doped n-type or p-type poly-Si, TiN or an electrically conductive silicide such as $WSi_2$.

The p-type third semiconductor regions 3 in FIG. 1 have a higher doping concentration than the first semiconductor region 1 as indicated by the symbols "p$^+$" and "p$^-$".

In one embodiment, to realize a low resistance Ohmic contact, the doping concentration of the fourth semiconductor region 4 is higher than the doping concentration of the second semiconductor region 2. Typical maximum doping concentrations range between about $10^{16}$ cm$^{-3}$ to about $10^{17}$ cm$^{-3}$ for the first (p$^-$) semiconductor region 1, between about $5*10^{16}$ cm$^{-3}$ to about $10^{20}$ cm$^{-3}$ for the third (p$^+$) semiconductor regions 3, between about $10^{12}$ cm$^{-3}$ to about $10^{14}$ cm$^{-3}$ for the second (n$^-$) semiconductor region 2, and between about $10^{19}$ cm$^{-3}$ to about a few times $10^{20}$ cm$^{-3}$ for the fourth (n$^+$) semiconductor regions 4. In addition, the semiconductor region 1 and the third semiconductor regions 3 may include p-type sub-regions which adjoin the anodes 6 and 8, respectively, and have, for improving the electrical contact, a higher doping concentration than the remaining portion of the first semiconductor region 1 and the third semiconductor regions 3, respectively.

With these doping concentrations, the bipolar semiconductor device 100 can be operated as a diode 14 with the first and third metallization 6 and 8, respectively, as common anode, the second metallization 7 as cathode 7, the fourth semiconductor region 4 as cathode emitter region 4, the second semiconductor region 2 as n-basis or drift region 2, the first pn-junction 11 as rectifying pn-load junction 11 and the first semiconductor region 1 including the third semiconductor regions 3 as a structured anode emitter 50. Thus, the semiconductor device 100 as described herein may form a speed diode with a structured anode emitter 50 including the additional field plate structures 95 the function of which is explained with reference to FIG. 3.

Figure 3:
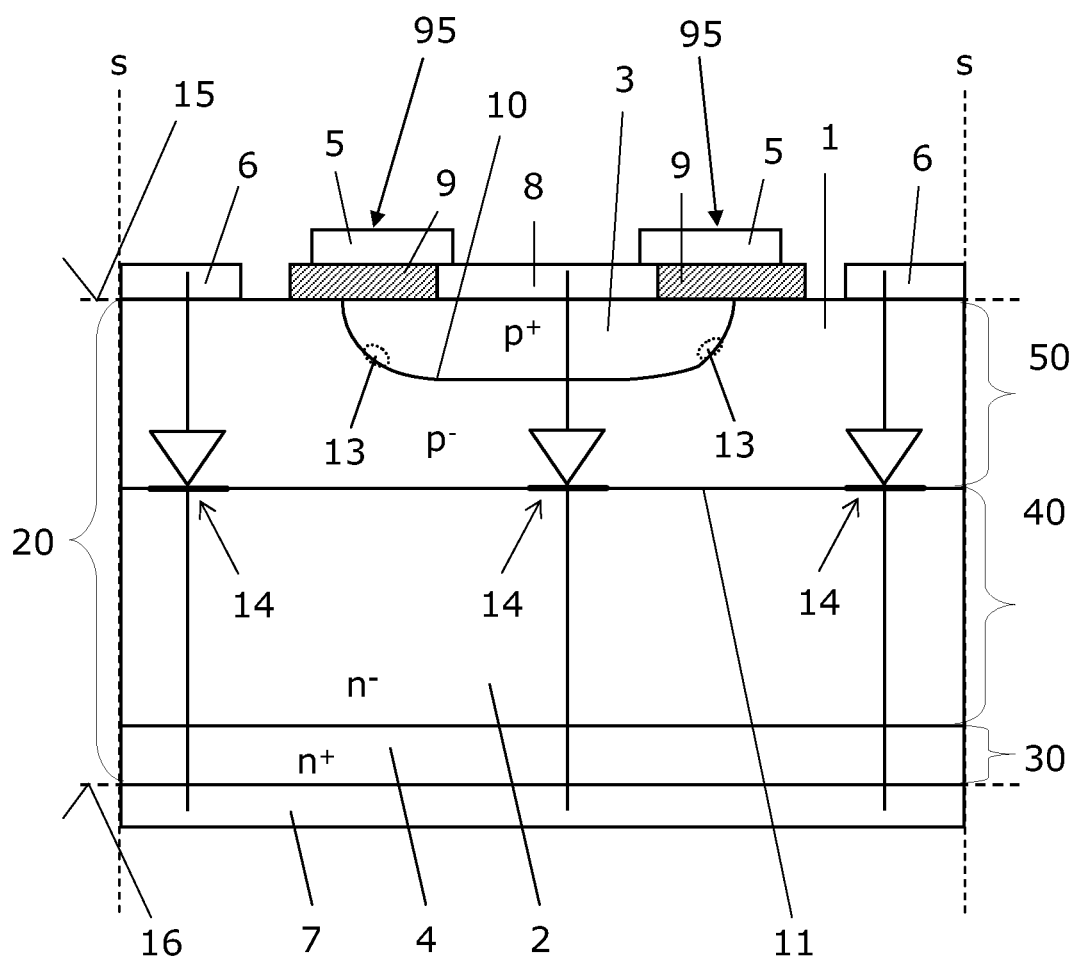
FIG. 3 illustrates, in a vertical cross-section, a central section of the semiconductor device of FIG. 1 according to one embodiment.

FIG. 3 corresponds to an enlarged section of FIG. 1 between the two dashed lines s. During normal operation, a forward current flows from the anodes 6 and 8 to the cathode 7 as indicated by the diode symbols 14. The forward current of the speed diode 100 of FIG. 3 flows via the typically weakly p-doped first semiconductor region 1. In the event of a surge current, charge carriers (holes) are injected from the typically highly p-doped third semiconductor region 3 into the first semiconductor region 1 resulting in a high surge current strength. In the event of switching off and/or commutating the current from the forward direction to the reverse current direction, charge carriers (holes) flow back to the anodes 6 and 8, and, depending e.g. on doping concentrations and slew rate, the p⁻ doping of the first semiconductor region 1 is partially compensated, fully compensated or even overcompensated for high enough slew rates. In the latter event, the first semiconductor region acts, at least during a certain time period of the current switching, like a weakly n-doped semiconductor region. The behavior of the semiconductor device 100, in one embodiment the time evolution of the electric field distribution therein, is then mainly determined by the junction 10 which may be described in this time period as a transient pn-junction between the highly p-doped third semiconductor region 3 and the first semiconductor region 1 dynamically acting like a weakly n-doped semiconductor region.

In a semiconductor device but without the field plate structures 95 regions of highest electric field strength are expected in a boundary region of the third semiconductor region 3 which is close to a curvature of the junction 10 as indicated by the dashed ellipses 13 during commutating and/or switching off. At high enough electric field strength an avalanche breakdown of such a device may occur in the regions 13. The field plate structure 95 of the semiconductor device 100 at least partially reduces the electric field strength in the regions 13, in one embodiment close to the junction 10, and hence the risk of an avalanche breakdown of the semiconductor device 100 is reduced. Consequently, the dynamic robustness during switching off and/or commutating is improved. The term "commutating" as used in this specification intends to describe the switching of the current of a bipolar semiconductor device from the forward direction or conducting direction in which the pn-load junction is forwardly biased to the opposite direction or reverse direction in which the pn-load junction is reversely biased.

Owing to the field plate structures 95, the semiconductor device 100 and diode 14, respectively, has, in addition to the high reverse voltage capability, the high surge current strength and the low forward voltage drop of conventional speed diodes, an improved reverse recovery characteristic. In other words, the semiconductor device 100 forms a speed-diode 14 with improved dynamic robustness during switching off and/or commutating.

The field plate structures 95 as described herein operate as junction termination structures which are configured to reduce the electric field strength in regions 13 of high field strength when the semiconductor device 100 is being switched off and/or commutated. In other words, the field plate structures 95 are configured to protect the semiconductor device 100 in the dynamic situation of switching off and/or commutating the load current. The field plate structures 95 and other junction termination structures for protecting a bipolar semiconductor device during switching off and/or commutating as described herein are provided for protecting regions of high electric field strength close to a junction between two regions of the same doping type but different doping concentration. As explained above, highest electric field strength is to be expected close to a junction between two regions of the same doping type but different doping concentration in a dynamic situation, in one embodiment when the doping is compensated or overcompensated by flowing charge carriers. The field plate structures 95 and other junction termination structures as described herein may also be configured to reduce the electric field strength in regions 13 close to a pn-junction of a bipolar semiconductor device during switching off and/or commutating, if the pn-junction is formed between a highly doped semiconductor region and a weakly doped semiconductor region. Typically, the doping concentration of the highly doped semiconductor region exceeds the doping concentration of the weakly doped semiconductor region by at least a factor of 3 or 10, more typically by at least two orders of magnitude. In other words, the field plate structures 95 and other junction termination structures for dynamic loads are arranged close to junctions between a highly and a weakly doped semiconductor region and/or close to junctions between semiconductor regions or semiconductor portions of the same doping type. The field plate structures 95 and other junction termination structures for dynamic loads as described herein protect a bipolar semiconductor device during switching off and/or commutating, but are typically not adapted to protect the semiconductor device 100 in a static or stationary condition of being switched on and/or reversely biased. Different thereto "peripheral" junction termination structures, e.g. conventional pn-junction termination structures, are formed at the periphery of the first semiconductor region 1 and typically used as edge terminations for static and/or stationary conditions. Furthermore, conventional pn-junction termination structures are typically arranged close to pn junctions between two weakly doped semiconductor regions.

Figure 4:
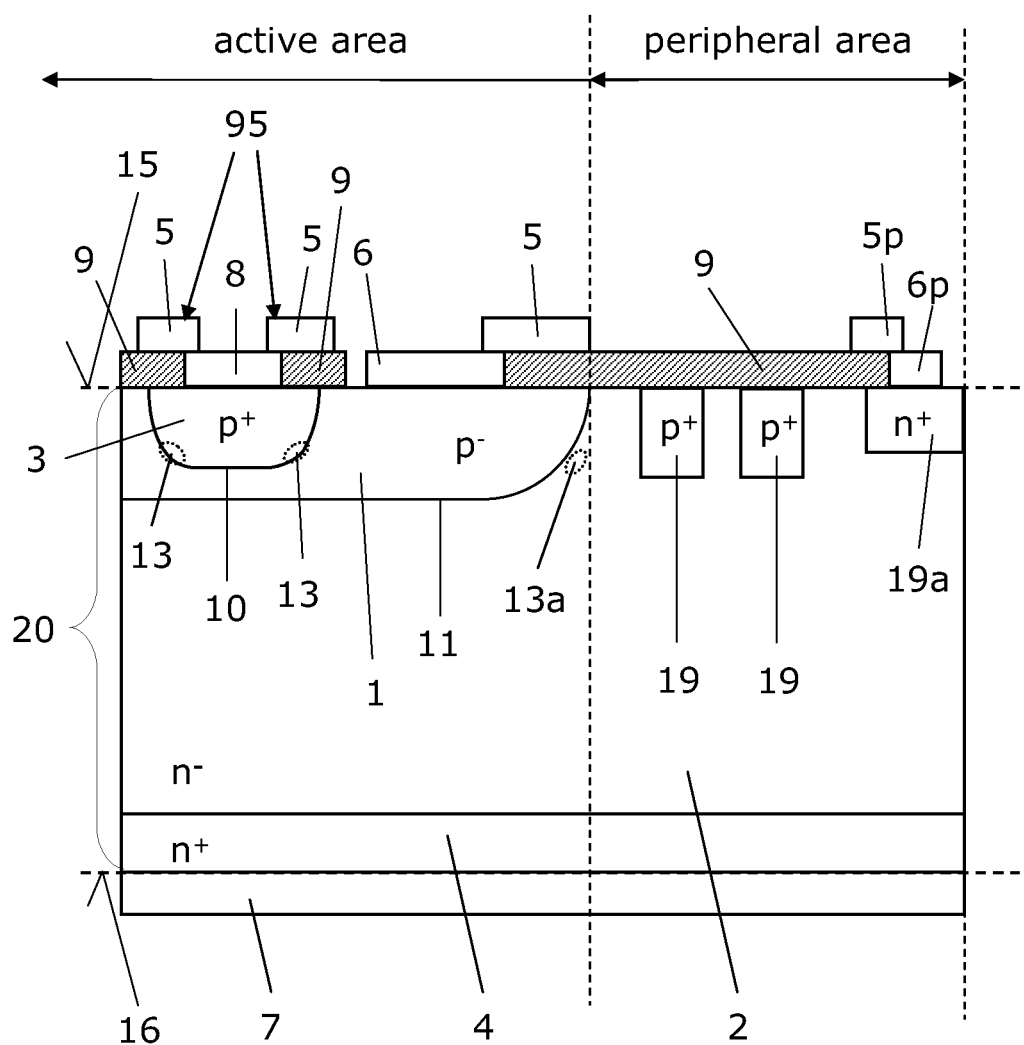
FIG. 4 illustrates, in a vertical cross-section, a section of a semiconductor according to one embodiment.

FIG. 4 illustrates, in a vertical cross-section, the boundary region of a bipolar semiconductor device according to an embodiment. An active area of the illustrated semiconductor device 100, which may be operated as a speed diode, includes a plurality of third semiconductor regions 3, each of which is provided with a respective field plate structure 95. For clarity reasons, only the third semiconductor region 3 closest to the right lateral boundary of the semiconductor device 100 is illustrated. As already explained with reference to FIGS. 1 to 3, the field plate structure 95 is configured to reduce the electric field strength in the regions of highest field strength 13 during switching off and/or commutating. Thus, the junctions 10, i.e. the junctions between regions of the same doping type, are provided with at least one junction termination structure.

In other words, the bipolar semiconductor device 100 includes an active area for carrying the load current and a peripheral area. The active area includes a first metallization which may include a first metallization portion 6 and a second metallization portion 8, a p-type first semiconductor region 1, an n-type second semiconductor region 2 which is typically spaced apart from the first metallization and forms a pn-junction 11 with first semiconductor region 1, and a plurality of third semiconductor region 3 forming respective junctions 10 with the first semiconductor region 1 and being connected with the first metallization. The first semiconductor region 1 is connected with the first metallization and has a doping concentration which is lower than the doping concentration of the third semiconductor region 3. The semiconductor device 100 further includes for each junction 10 at least a junction termination structure having a field plate structure.

In the peripheral area the first semiconductor region 1 is not formed so that the second semiconductor region 2 typically extends to the first surface 15. This results in a curvature of the pn-junction 11 which is typically protected by conventional pn-junction termination structures adjoining the second semiconductor region 2.

In a static or stationary condition or state, in which the semiconductor device 100 is switched on or reversely biased, the field plate structure 95 does typically not function as protective structures. For example, when the stationary condition after reversely biasing the speed diode 100 is reached, the first semiconductor region 1 and at least parts of the third semiconductor region are depleted. In this situation, the first semiconductor region 1 behaves as a depleted weakly p-doped semiconductor region and the highest electric field strength is to be expected in a region 13a close to the curvature of the pn-junction 11 formed between the weakly doped first semiconductor region 1 and the weakly doped second semiconductor region 2. To protect the semiconductor device 100 against avalanche breakdown in this situation, i.e. to increase the reverse breakdown voltage of the semiconductor device 100, the peripheral area may include two heavily p-doped floating guard rings 19 operating as conventional pn-junction termination structures and a further heavily n-doped channel stopper region 19a connected to a field plate structure formed by two connected metal regions 5p and 6p, and the insulating region 9 in the peripheral area. The conventional pn-junction termination structures, such as the illustrated floating guard rings 19 or field plate structures, are typically arranged to broaden the final space charge region formed when the semiconductor device is reversely biased, thereby reducing the electric field strength in the region 13a. In other words, the conventional junction termination structures arranged in the peripheral area are typically adapted to reduce the field strength in static or stationary conditions, whereas the junction termination structures provided for the third semiconductor regions 3 of the active area are adapted to reduce the field strength in the dynamic situation when the semiconductor device 100 is being switched off and/or commutated. This applies also to the junction termination structures provided for the third semiconductor regions 3 in the following Figures.

Figure 5:
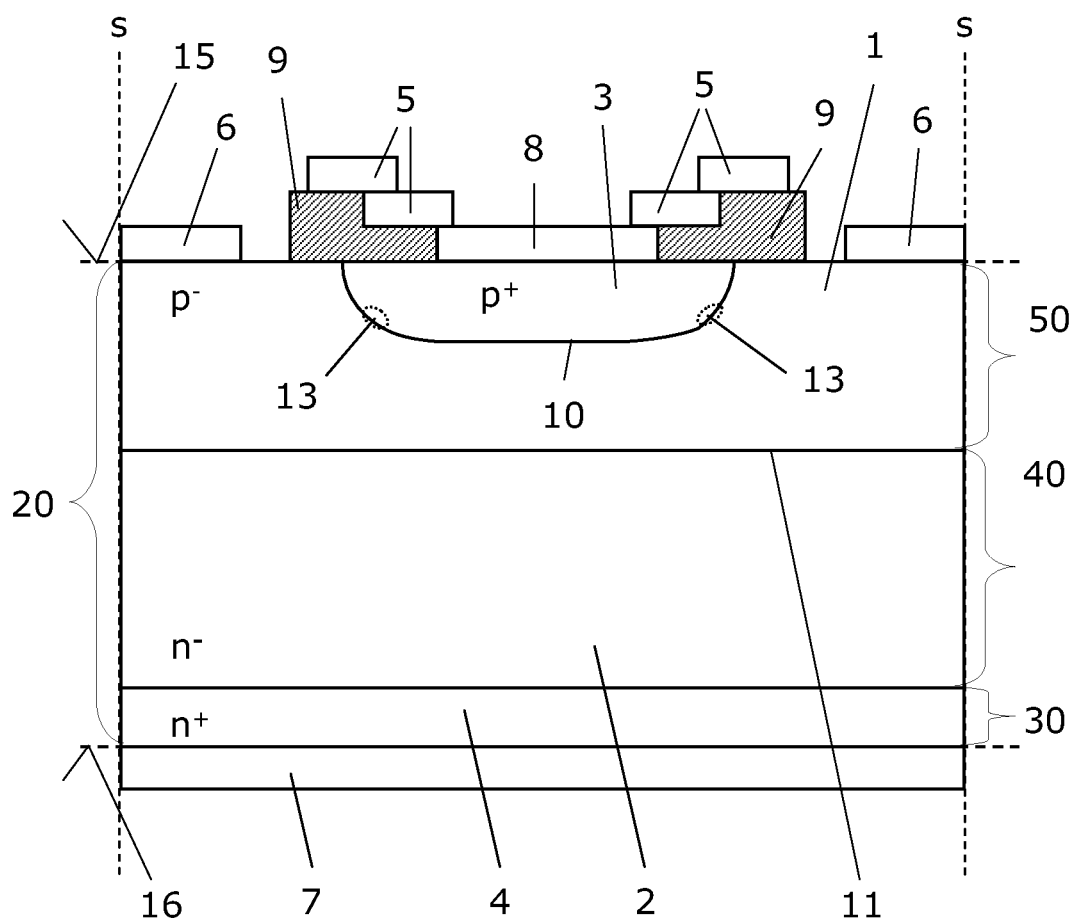
FIG. 5 illustrates a vertical cross-section of a semiconductor device according to one embodiment.

The field plate structure 95 of the semiconductor device 100 illustrated in FIG. 5 is similar to the field plate structure 95 of the semiconductor device 100 of FIGS. 1 to 4. However, in the embodiment of FIG. 5 the third semiconductor region 3 is provided with a step-lined field plate structure 95, i.e. a field plate structure 95 which includes, in a vertical cross-section, a stepped portion. The vertical cross-section illustrated in FIG. 5 typically represents only a fraction or unit cell of the active area of the semiconductor device 100, which typically includes a plurality of those unit cells. Whether the field plate structure 95 includes one process as illustrated or several processes as well as the process geometry typically depends on the function of the semiconductor device 100 and on the geometry and doping concentrations of the semiconductor regions. The number of processes and the geometry of the field plate structure 95 may be chosen according to specific needs and/or adapted by using numerical device simulations.

Figure 6:
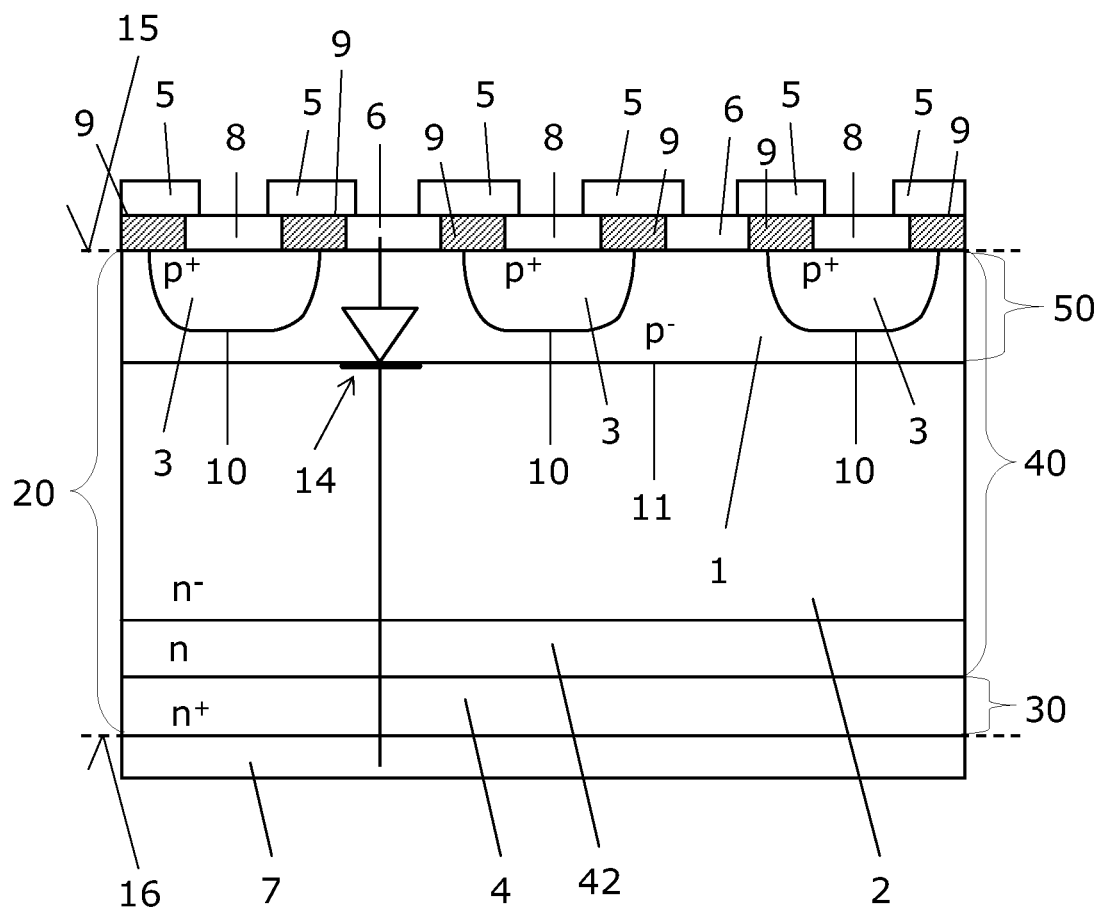
FIG. 6 illustrates a vertical cross-section of a semiconductor device according to one embodiment.

With respect to FIG. 6 further embodiments are explained. The semiconductor device 100 of FIG. 6 is similar to the semiconductor device 100 of FIG. 1. However, the field plates 5 and the first and third metallization 6 and 8 form a simply connected metallization. Consequently, only one external connection will be required for connecting the anode when the device 100 is operated as a speed diode.

Furthermore, an optional n-type stopping region or layer 42 is arranged between the second semiconductor region 2 and the fourth semiconductor region 4. Typically, the doping concentration of the stopping layer 42 is chosen in a range between the doping concentrations of the adjoining second and fourth semiconductor regions 2 and 4. It goes without saying, that such a stopping layer 42 may optionally be arranged also between the second semiconductor region 2 and the fourth semiconductor region 4 of the semiconductor devices 100 illustrated in the other Figures.

According to one embodiment, insulating structures 9 are formed on the first surface 15. The insulation structures 9 cover the edges of a respective third semiconductor region 3. The junctions 10 are thereby covered by an insulating structure. A conductive layer 5, or respective conductive layers 5, can be formed on the insulation structures 9. The conductive layer 5 can be in electrical contact with the first semiconductor region or insulated therefrom. In the embodiment of FIG. 6, the respective conductive layers 5 are in contact with the third semiconductor region 3. The conduction layer 5 or conductive layers 5 can be formed by the first metallization, or third metallization or both metallizations.

Figure 7:
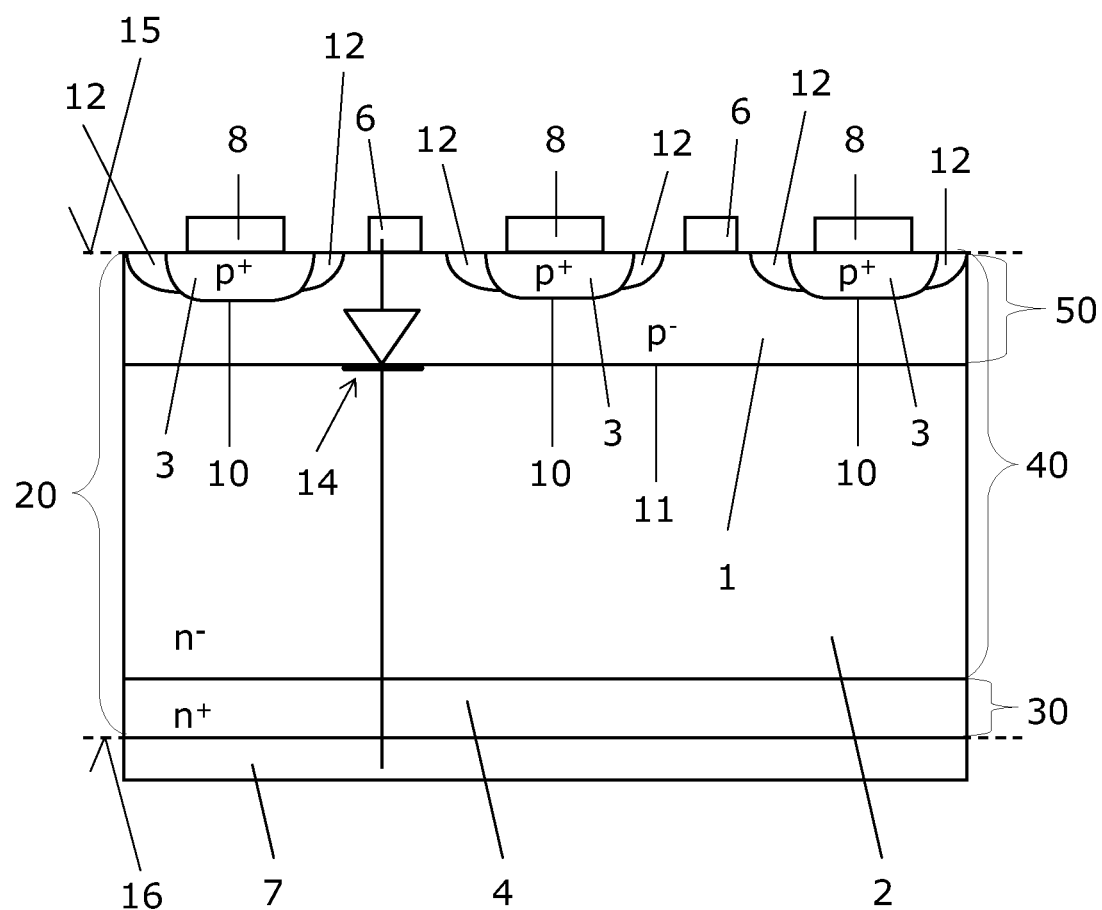
FIG. 7 illustrates a vertical cross-section of a semiconductor device according to one embodiment.

FIG. 7 illustrates, in a vertical cross-section, a semiconductor device 100 according to yet a further embodiment. The semiconductor device 100 of FIG. 7 is similar to the semiconductor device 100 of FIG. 1. However, each of the third semiconductor regions 3 are provided with a VLD-structure 12 (VLD=Variation of Lateral Doping) instead of a field plate structure 95. In a vertical cross-section, two p-type semiconductor zones 12 adjoin each third semiconductor region 3 or semiconductor well 3. The two illustrated zones 12 adjoining a respective third semiconductor region 3 may also be simply connected when the third semiconductor regions 3 or semiconductor wells 3 are shaped as explained with reference to FIG. 2B, this means e.g. that the semiconductor wells 3 are concentrically shaped. The doping concentration of the semiconductor zones 12 decreases with increasing horizontal distance from the respective semiconductor well 3. In doing so, the electric field strength close to the curvature of the junction 10 can also be reduced during switching off and/or commutating of the load current. The VLD structures 12 may be manufactured by implantation using a mask with openings having e.g. a decreasing horizontal width and/or an increasing horizontal distance with increasing horizontal distance from the respective third semiconductor regions 3, and a subsequent thermal drive-in diffusion process.

Figure 8:
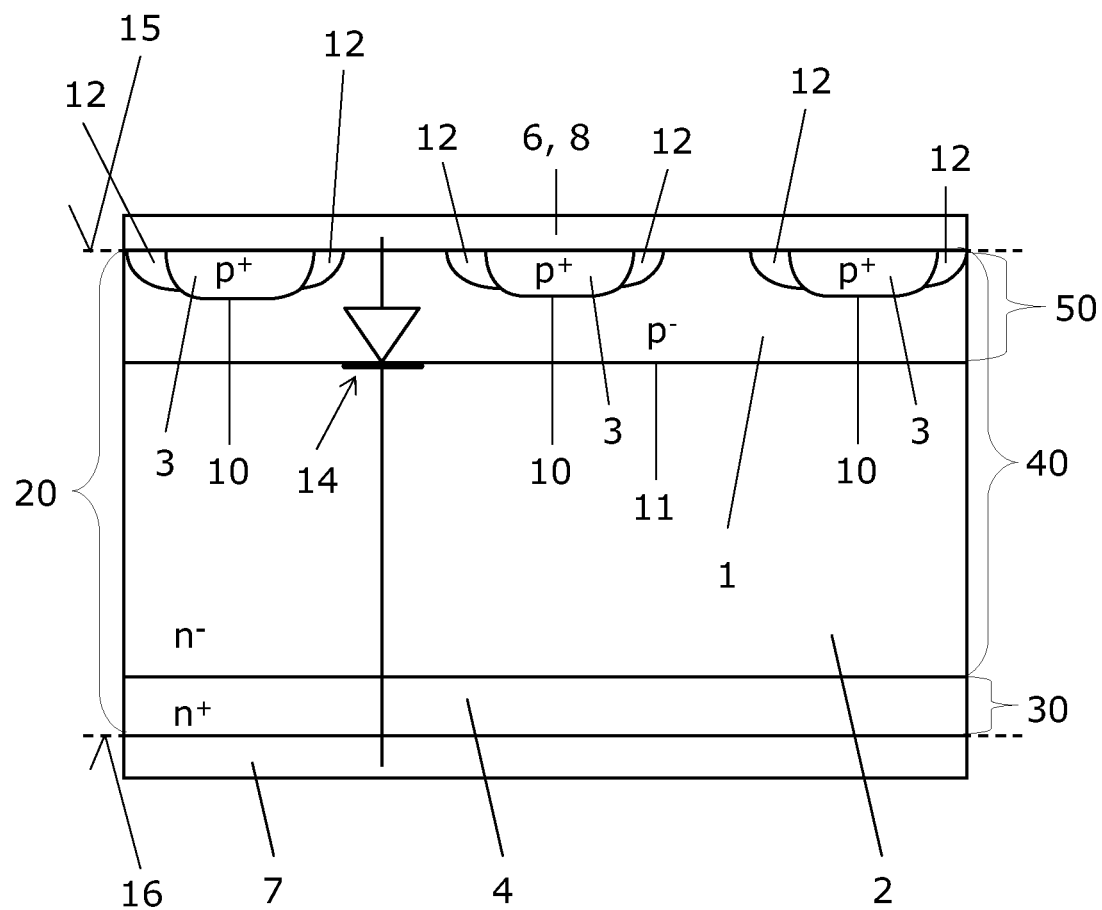
FIG. 8 illustrates a vertical cross-section of a semiconductor device according to one embodiment.

With respect to FIG. 8 further embodiments are explained. The semiconductor device 100 of FIG. 8 is similar to the semiconductor device 100 of FIG. 7. However, the field plates 5 and the first and third metallization 6 and 8 form a simply connected metallization. In the embodiments, field plates 5 with isolation layers 9 can be used.

Figure 9:
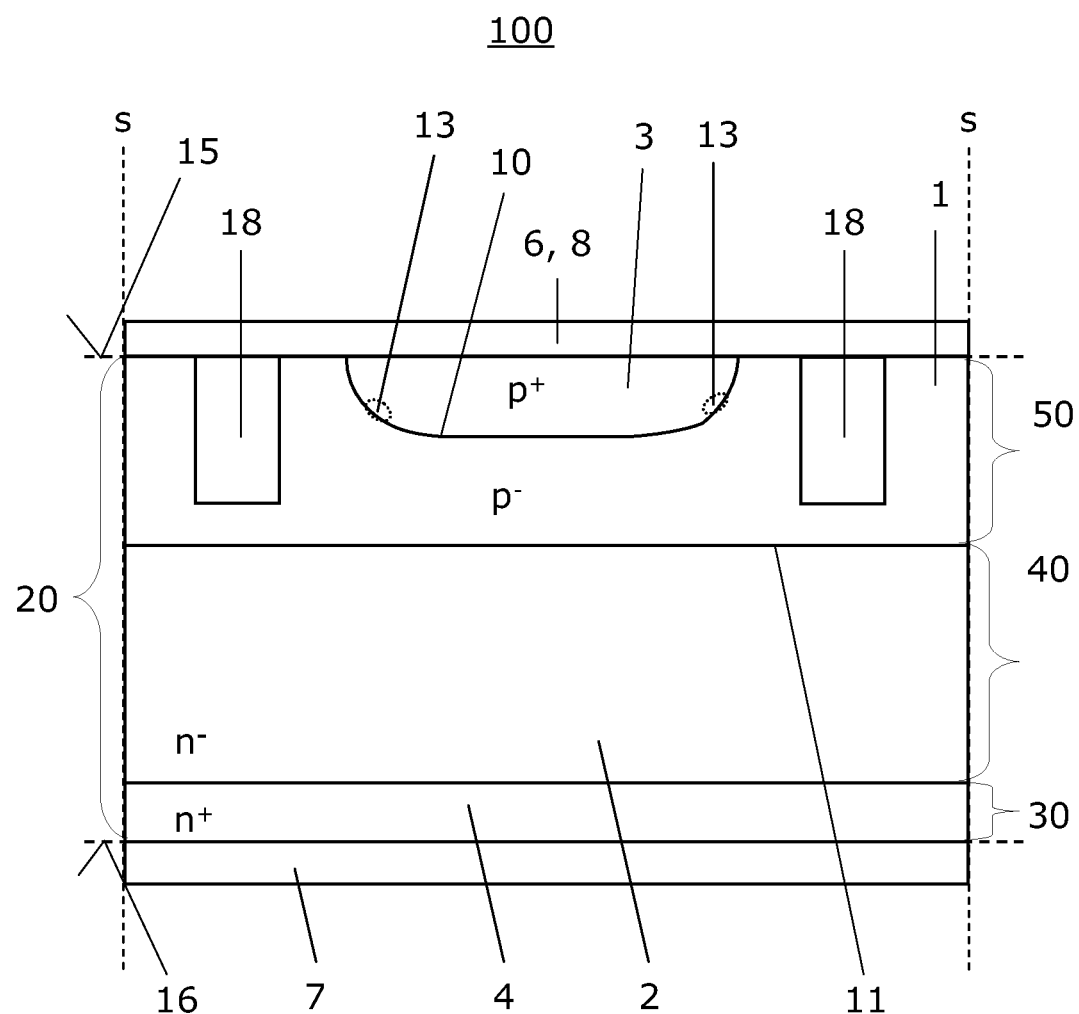
FIG. 9 illustrates a vertical cross-section of a semiconductor device according to one embodiment.
Figure 10:
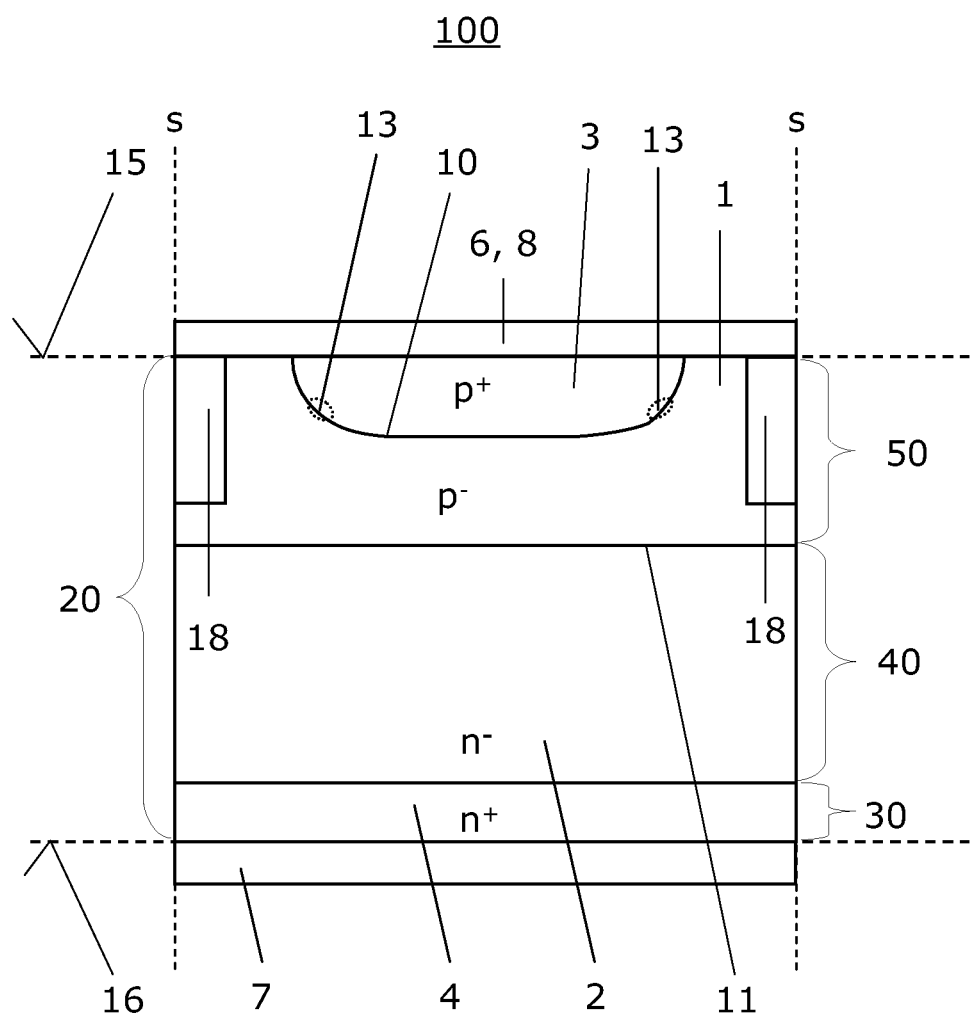
FIG. 10 illustrates a vertical cross-section of a semiconductor device according to one embodiment.
Figure 11:
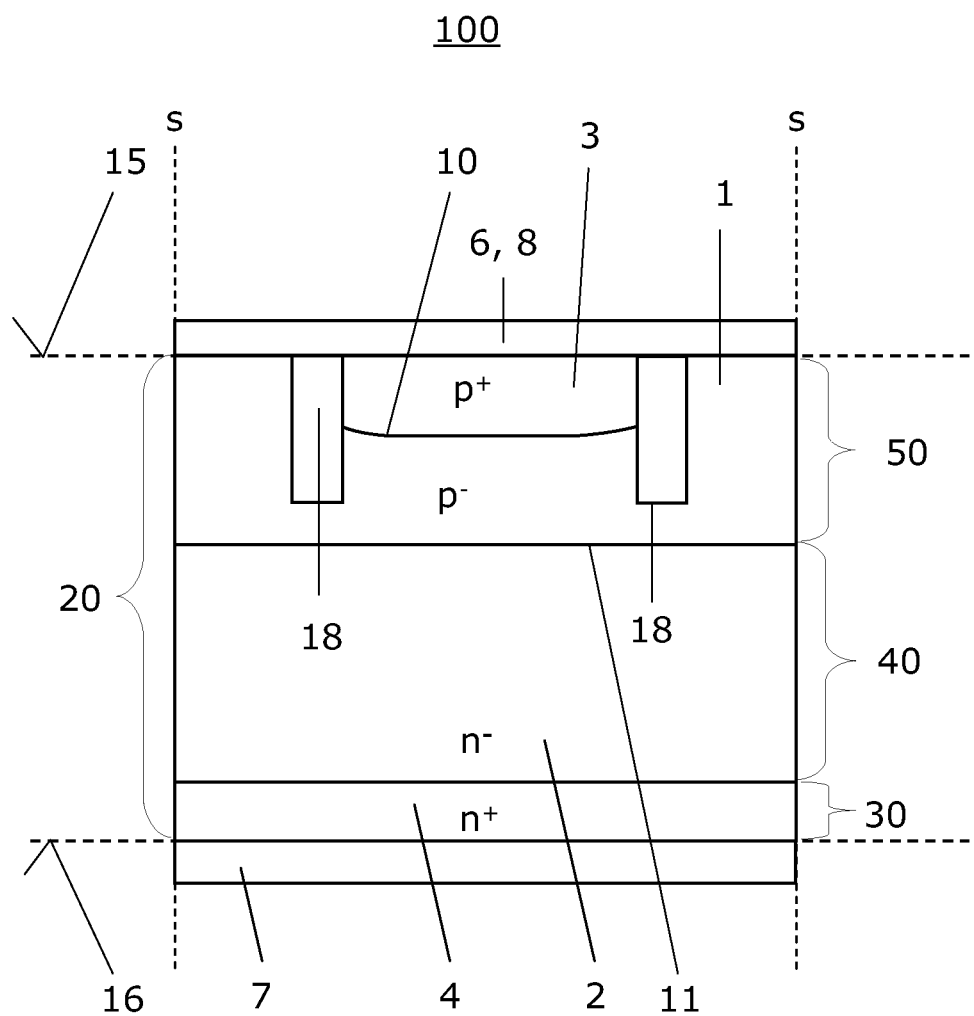
FIG. 11 illustrates a vertical cross-section of a semiconductor device according to one embodiment.

In the embodiments illustrated in FIGS. 9, 10 and 11, the junction termination structures are formed as insulating trenches 18. For example, oxide filled trenches 18 extending from the first surface 15 into the first semiconductor region 1 reduce the electric field strength in the region 13 close to the curvature of the junction 10 during switching off and/or commutating. Again, the two illustrated trenches 18 may also be simply connected when the third semiconductor regions 3 or semiconductor wells 3 are shaped as explained with reference to FIG. 2B. When the illustrated section of the semiconductor device in FIG. 10 corresponds to a unit cell of the active area, neighboring third semiconductor regions or wells 3 may share a trench 18. In the embodiment of FIG. 9, neighboring third semiconductor regions or wells 3 are typically provided with trenches 18 of their own. The trenches 18 may be spaced apart from the semiconductor wells 3 as illustrated in FIGS. 9 and 10 or adjoining the semiconductor wells 3 as illustrated in FIG. 11. In the latter event, the trenches 18 are typically arranged such that the junctions 10 have only a small curvature, or that the junction 10 is flat or almost flat. This significantly reduces the geometric concentration of electric field lines which may be associated with curved junctions 10 in semiconductor devices without junction termination structures provided to the junctions 10 during switching off and/or commutating the load current.

Figure 12:
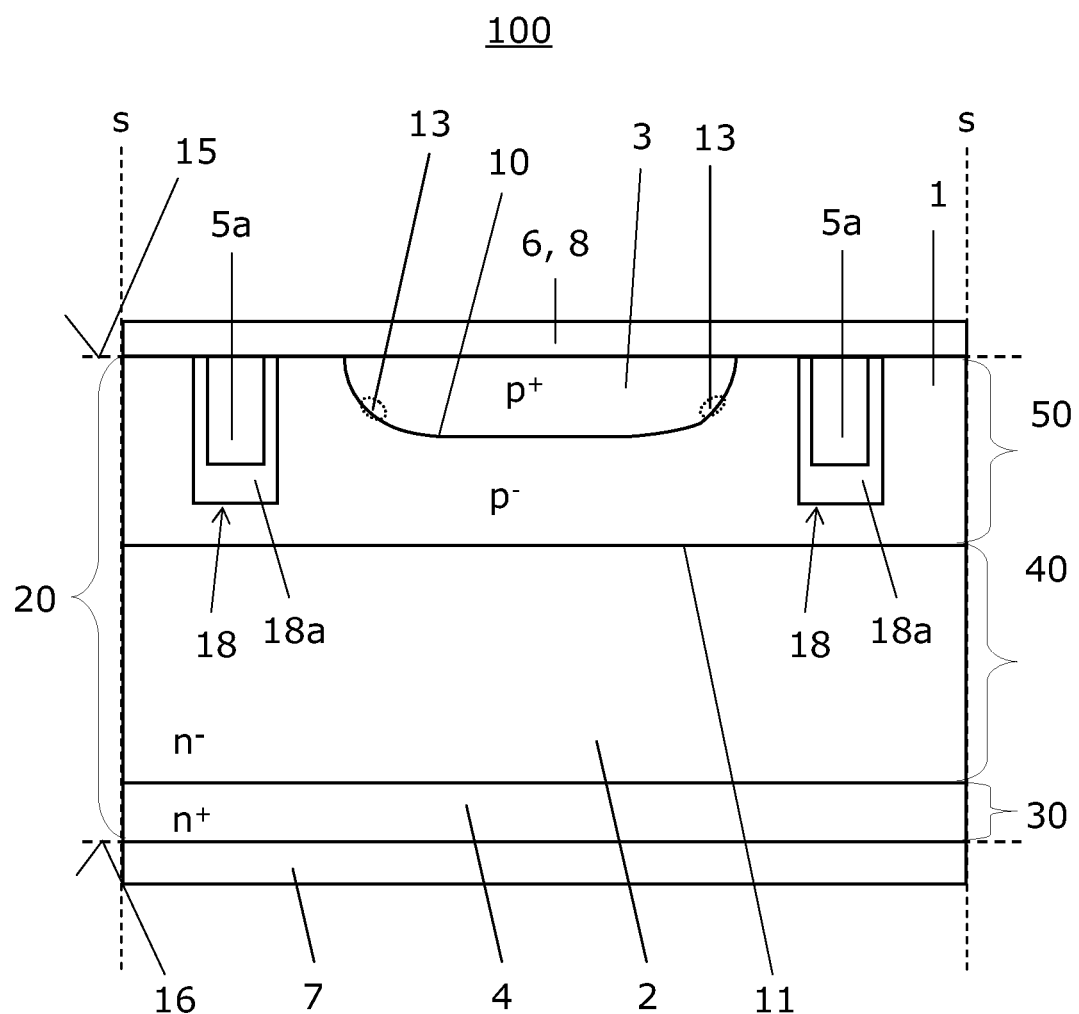
FIG. 12 illustrates a vertical cross-section of a semiconductor device according to one embodiment.

As illustrated in FIG. 12, the vertical trenches 18 which are only partially filled with an insulating or dielectric layer 18a may additionally include a vertical field plate 5a which is connected to the common metallization 6,8.

Figure 13:
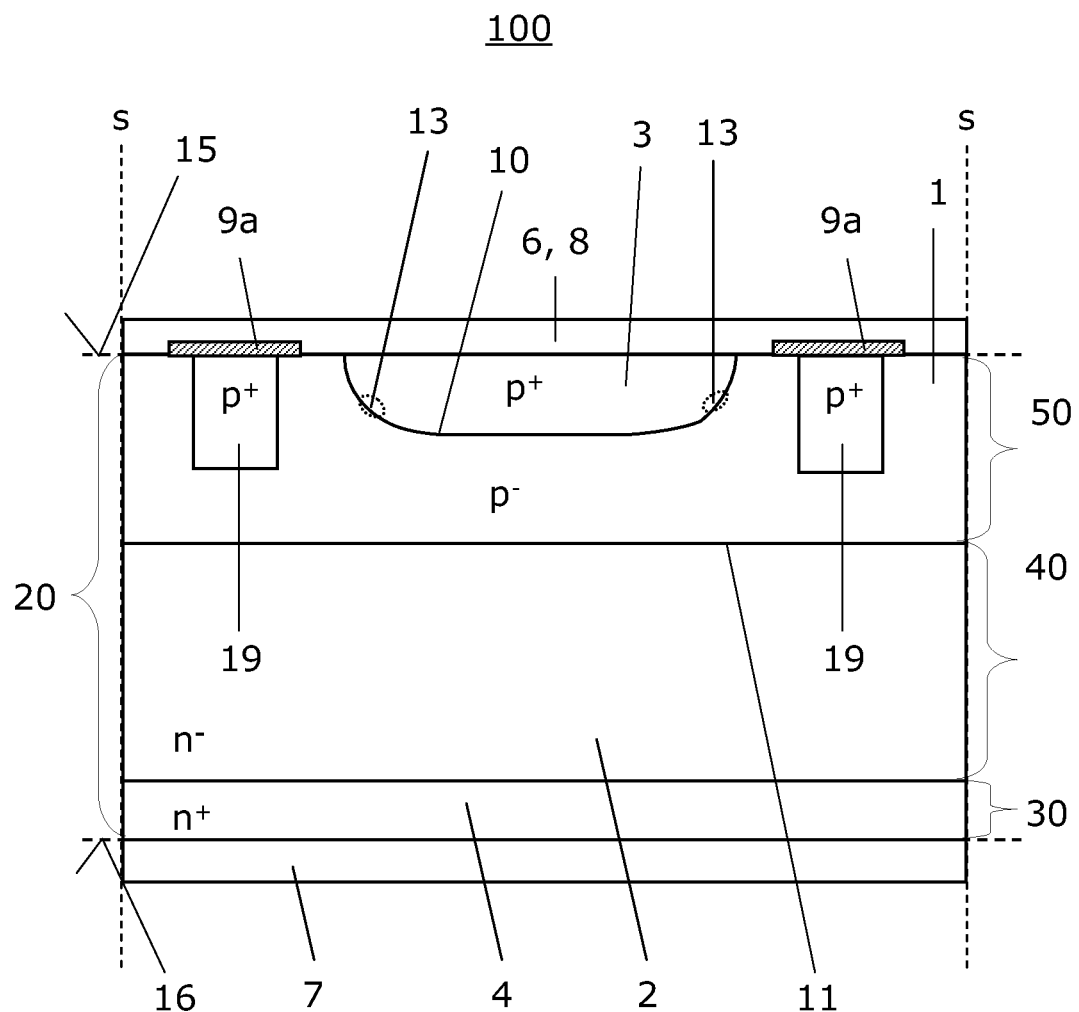
FIG. 13 illustrates a vertical cross-section of a semiconductor device according to one embodiment.

With respect to FIG. 13 still a further embodiment of a junction termination structure for the dynamic state of switching off and/or commutating a semiconductor device is explained. The semiconductor device 100 of FIG. 13 is similar to the semiconductor devices 100 of the previous Figures and may also be operated as a speed diode. However, in FIG. 13 floating guard rings 19 are embedded within the first semiconductor region 1 and used to reduce the electric field strength in the regions 13 during switching off and/or commutating. The illustrated regions 19 may form a simply connected ring shaped region when the third semiconductor regions 3 are shaped as explained with reference to FIG. 2B; or may be bar shaped when the third semiconductor regions 3 are shaped as explained with reference to FIG. 2A. The floating guard rings 19 are typically formed as heavily doped p-type semiconductor regions 19 which are insulated from the first and third metallization 6 and 8 by an insulating portion 9a.

In the above described embodiments of semiconductor devices 100, each region 13 of high field strength during switching off and/or commutating is typically provided with one junction termination structure. It is however also possible to arrange two or more junction termination structure, e.g. two floating guard rings 19 or a floating guard ring 19 and a field plate structure 95, next to each region 13 of high field strength.

Figure 14:
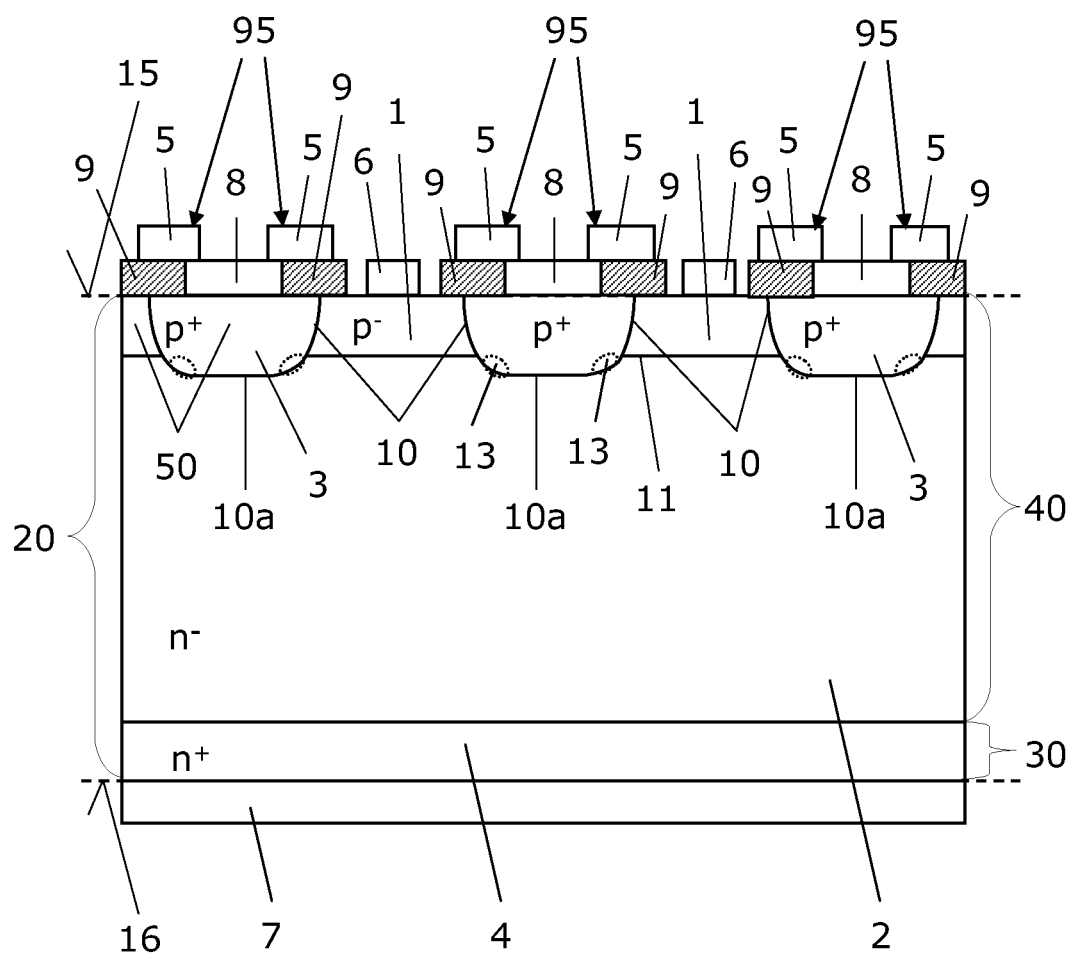
FIG. 14 illustrates a vertical cross-section of a semiconductor device according to one embodiment.

FIG. 14 illustrates, in a vertical cross-section, a semiconductor device 100 according to yet a further embodiment. The semiconductor device 100 of FIG. 14 is similar to the semiconductor device 100 of FIG. 1. However, the second and third semiconductor regions 2 and 3 adjoin each other in FIG. 14, whereas the second and third semiconductor regions 2 and 3 are spaced apart from each other, i.e. completely separated by portions of the first semiconductor region 1, in FIG. 1. In other words, the third semiconductor regions 3 in FIG. 14 are only partially embedded in the first semiconductor region 1 and the weakly doped second semiconductor region 2 and the heavily doped third semiconductor region 3 in FIG. 14 form a further pn-junction 10a in their boundary region. The further pn-junction 10a and the first pn-junction 11 form a common pn-load-junction. Since each of the third semiconductor regions 3 is provided with a respective field plate structure 95, the semiconductor device 100 of FIG. 14 may also form a speed-diode with improved dynamic robustness during switching off and/or commutating. In a semiconductor device but without the field plate structures 95, regions of highest electric field strength 13 during commutating and/or switching off are expected in boundary regions of the third semiconductor regions 3 which are close to a curvature of the pn-junction 10a. For clarity reasons, only two of the dashed ellipses are designated with the reference sign 13.

Figure 15:
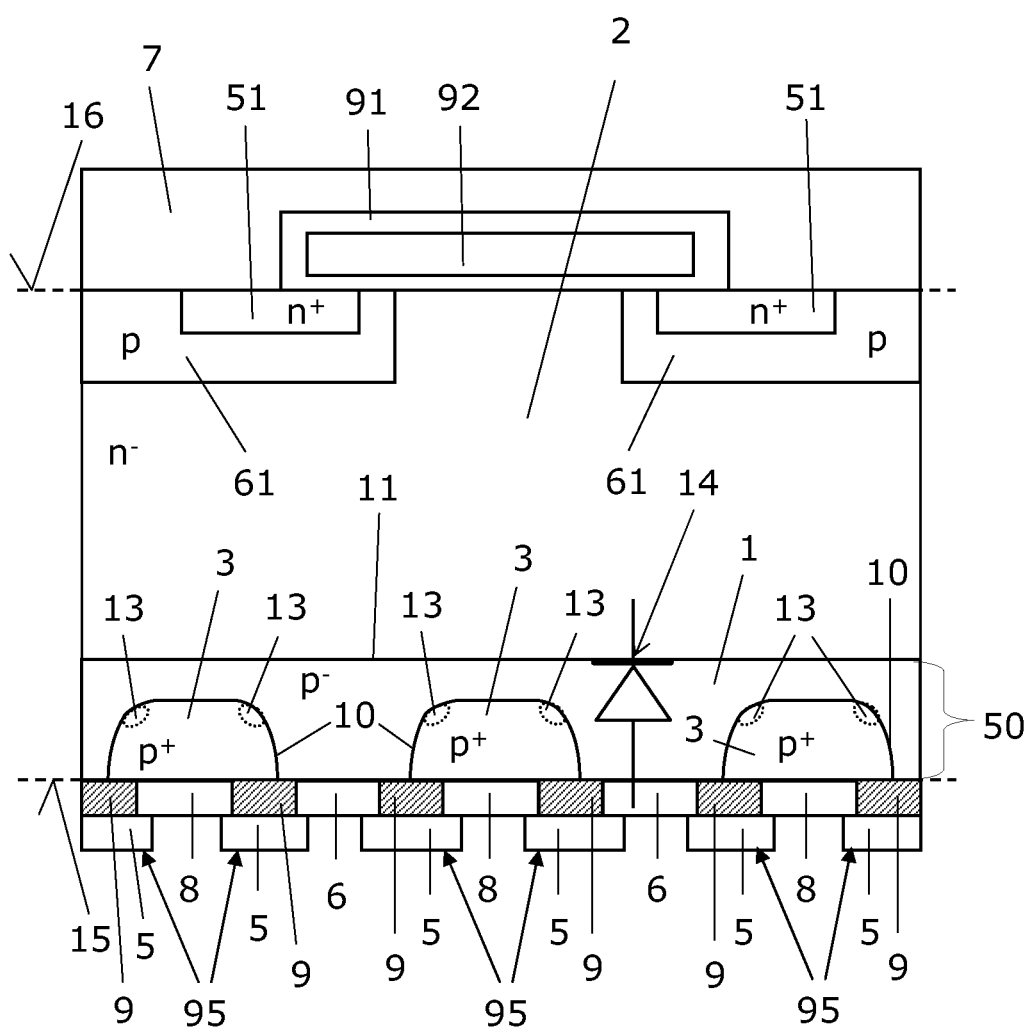
FIG. 15 illustrates a vertical cross-section of a semiconductor device according to one embodiment.

The above described structured anode emitters 50 which are provided with junction termination structures for dynamic loads can be used in other bipolar semiconductor devices such as IGBTs and thyristors too. An example is given in FIG. 15 showing a vertical cross-section through an IGBT (Insulated Gate Bipolar Transistor) having a structured emitter 50 provided with field plate structures 95. In this embodiment, the first and third metallization 6 and 8, the second metallization 7 and the second semiconductor region 2 refer to a collector electrode, a source electrode 7 and a drift region 2, respectively. In addition, an n-type fifth semiconductor region 51 forming a source region 51 and a p-type sixth semiconductor region 61 forming a body region 61 are typically connected to the source electrode 7. Further pn-junctions are formed between the body region 61 and the source region 51 as well as between the drift region 2 and the body region 61. Furthermore, a channel can be formed in forward mode, in which the load junction 11 is forwardly biased, by applying an appropriate voltage to a gate electrode 92 insulated by a dielectric layer 91 and arranged next to a channel forming region of the body region 61. Since each of the third semiconductor regions 3 of the structured emitter 50 is provided with a field plate structure 95, the dynamic robustness during switching off and/or commutating which may be required in the events of a short circuit and/or an over current of such an IGBT is improved. In an IGBT but without the field plate structures 95, regions of highest electric field strength 13 during commutating and/or switching off are expected in boundary regions of the third semiconductor regions 3 which are close to a curvature of the junction 10.

An anode emitter 50 which is provided with junction termination structures for dynamic loads as described herein may also replace anode emitters in a thyristor to improve its dynamic robustness during switching off and/or commutating.

The above described bipolar semiconductor devices 100 may also be described as a speed diode structure 100 which includes an anode metallization 6, 8, a cathode metallization 7, a first weakly doped p-type semiconductor region 1 which is electrically connected with the anode metallization 6,8, and a second weakly doped n-type semiconductor region 2 arranged between the first semiconductor region 1 and the cathode metallization 7 and forming a pn-junction 11 with the first semiconductor region 1. The pn-junction defines a forward current flow direction. At least one p-type semiconductor well 3 is embedded in the first semiconductor region 1 and has a doping concentration which is higher than the doping concentration of the first semiconductor region 1. At least one junction termination structure is arranged next to the semiconductor well 3, adjoins the first semiconductor region 1 and is adapted to reduce the electric field strength in the at least one semiconductor well 3 close to the first semiconductor region 1 when the pn-junction 11 is reversely biased during at least one of commutating and switching off of the forward current. In other words, the speed diode structure includes a structured anode emitter 50 having junction termination structures for dynamic loads. In embodiments in which the speed diode structure forms a speed diode 100, the second semiconductor region 2 is typically in Ohmic connection with the cathode metallization 7. In other embodiments, e.g. when the speed diode structure forms a part of a thyristor or an IGBT, a further pn-junction is arranged between the second semiconductor region 2 and the cathode metallization 7.

A structured cathode emitter provided with junction termination structures for dynamic loads having the same or a similar geometry as the structured anode emitter 50 but reversed doping types can be used in one embodiment and/or in addition in bipolar semiconductor devices.

Furthermore, structured anode and/or cathode emitters as described herein can be used in vertical bipolar semiconductor devices as illustrated in FIGS. 1 to 15 as well as in planar bipolar semiconductor devices in which the anode and cathode are arranged on the same surface of the semiconductor body.

Figure 16:
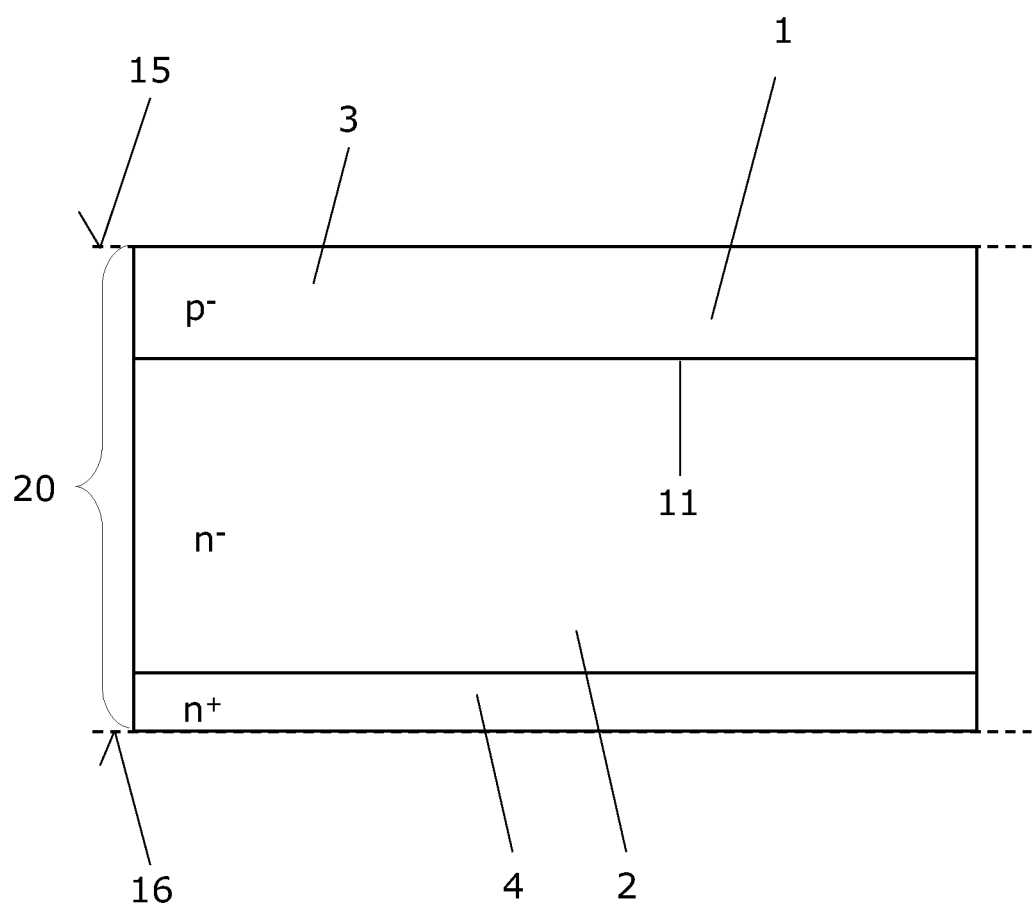
FIGS. 16-20 illustrate manufacturing processes according to one or more embodiments.
Figure 17:
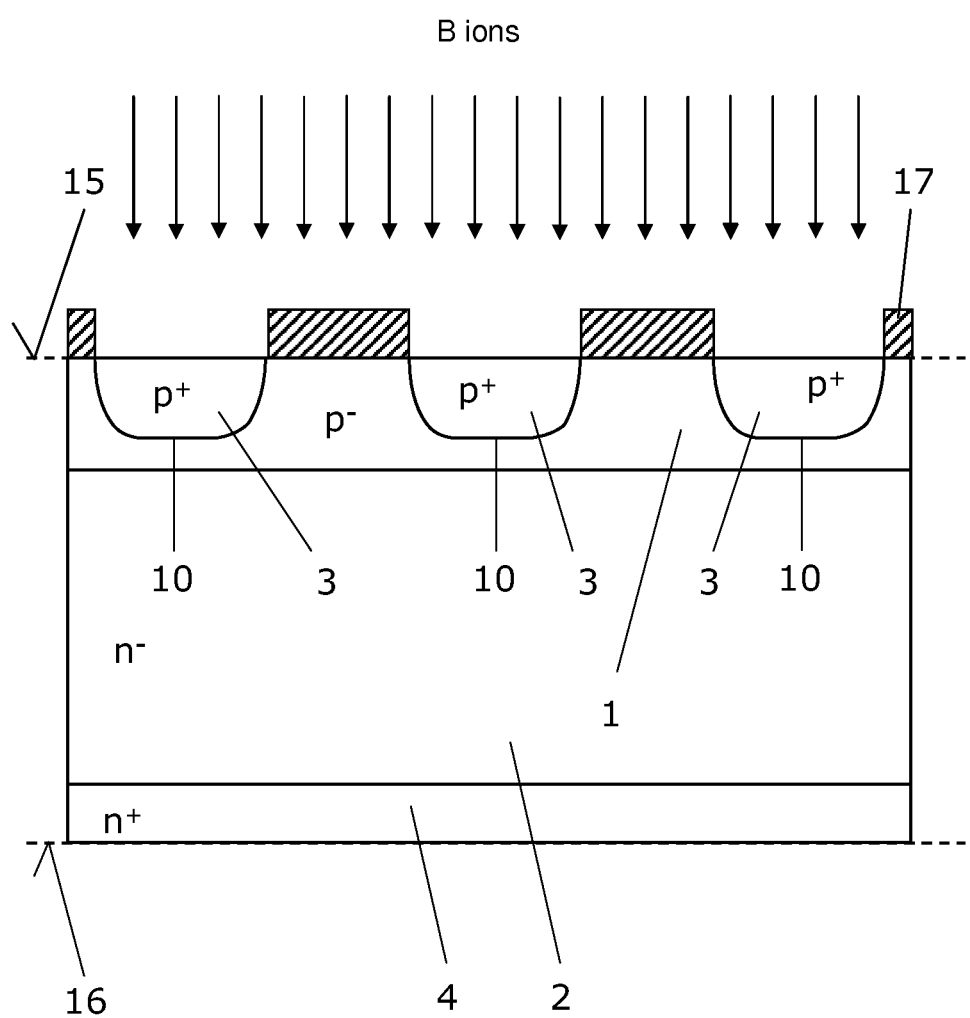
Figure 18:
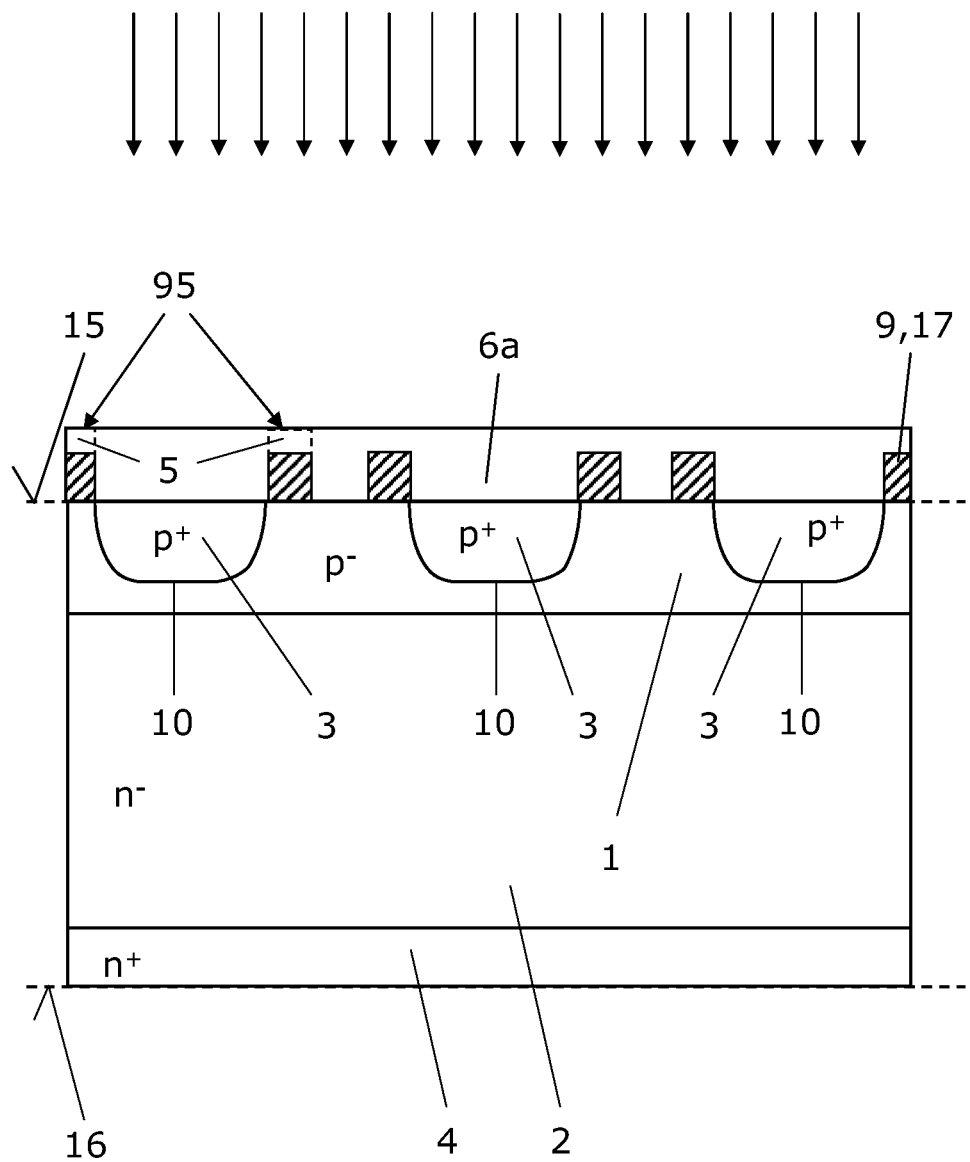

With respect to FIGS. 16-20 manufacturing processes according to several embodiments are illustrated. FIG. 16 illustrates a semiconductor device 100 after providing a semiconductor substrate 20 which includes a weakly doped p-type first semiconductor region 1 and a weakly doped n-type second semiconductor region 2. The first semiconductor region 1 and the second semiconductor region 2 form a first pn-junction 11. Typically, the semiconductor substrate 20 already includes a highly doped n-type fourth semiconductor region 4 which adjoins the second semiconductor region 2 and extends to a second surface 16 arranged opposite to the first surface 15. In a subsequent process, a structured mask 17 is typically arranged on the first surface 15 of the semiconductor substrate 20 and several highly doped p-type third semiconductor regions 3 are formed, e.g. by ion implanting with boron ions and a subsequent high-temperature process, such that the first semiconductor region 1 and the third semiconductor regions 3 form respective junctions 10. In other words, the third semiconductor regions are formed as semiconductor regions having a doping concentration which is higher than the doping concentration of the first semiconductor region and such that each of the plurality of third semiconductor regions 3 is at least partially arranged in the first semiconductor region 1. This is illustrated in FIG. 17. The temperature to activate and/or in-diffuse the implanted dopants maybe in a range of about 350° C. to about 1250° C. The duration of this high temperature process typically ranges between about a few seconds to about a few hours. If the structured mask 17 is made as an appropriate insulating layer such as $SiO_2$ or SiN, the subsequent process of metal deposition may be carried out directly. In the event of using a photoresist as structured mask 17, the resist has typically to be replaced by an appropriate insulating layer 9. A metallization 6a is formed on the first surface 15 of the semiconductor substrate 20, e.g. by PVD (Physical vapor deposition) process such as a sputter deposition, such that the first metallization 6a is in Ohmic contact with the first semiconductor region 1 and the third semiconductor regions 3. In doing so, each third semiconductor region 3 and the respective junction 10, respectively, is additionally provided with a junction termination structure 95 formed as a field plate structure 95. This is illustrated in FIG. 18. For clarity reasons, only one of the three field plate structures is designated with a reference sign 95.

Figure 19:
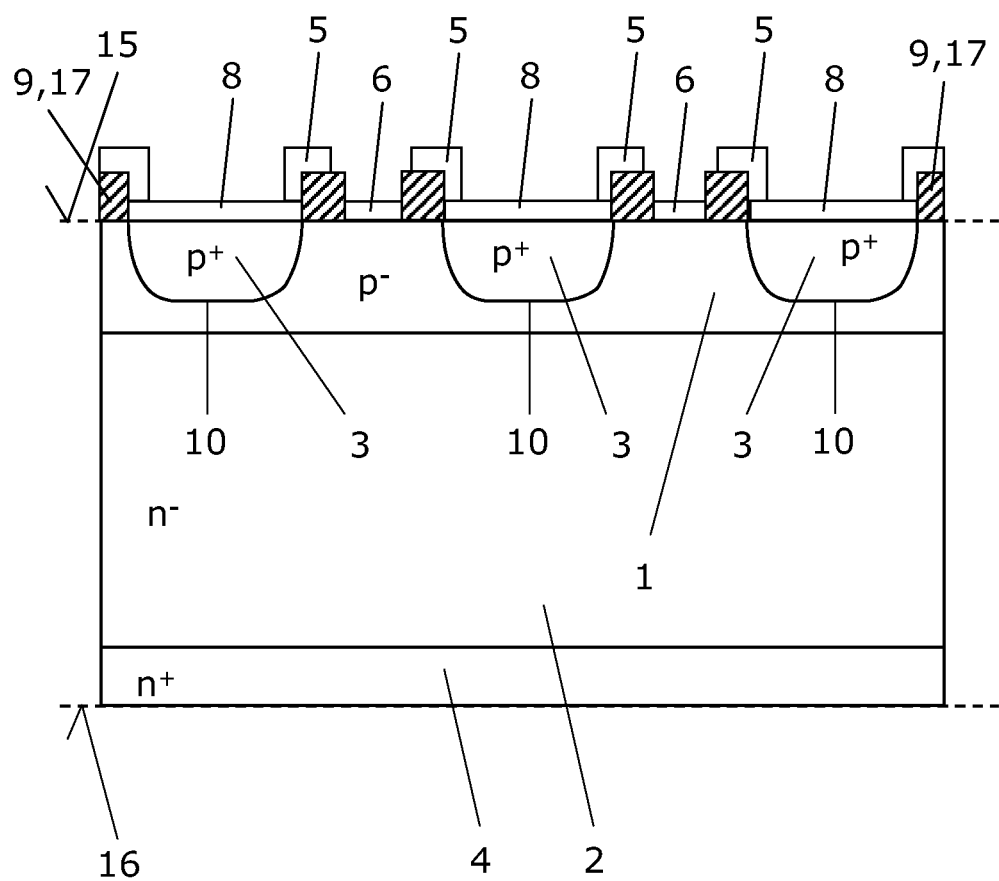

In another embodiment, the first metallization 6a is structured in a subsequent process resulting in the semiconductor device illustrated in FIG. 19

Figure 20:
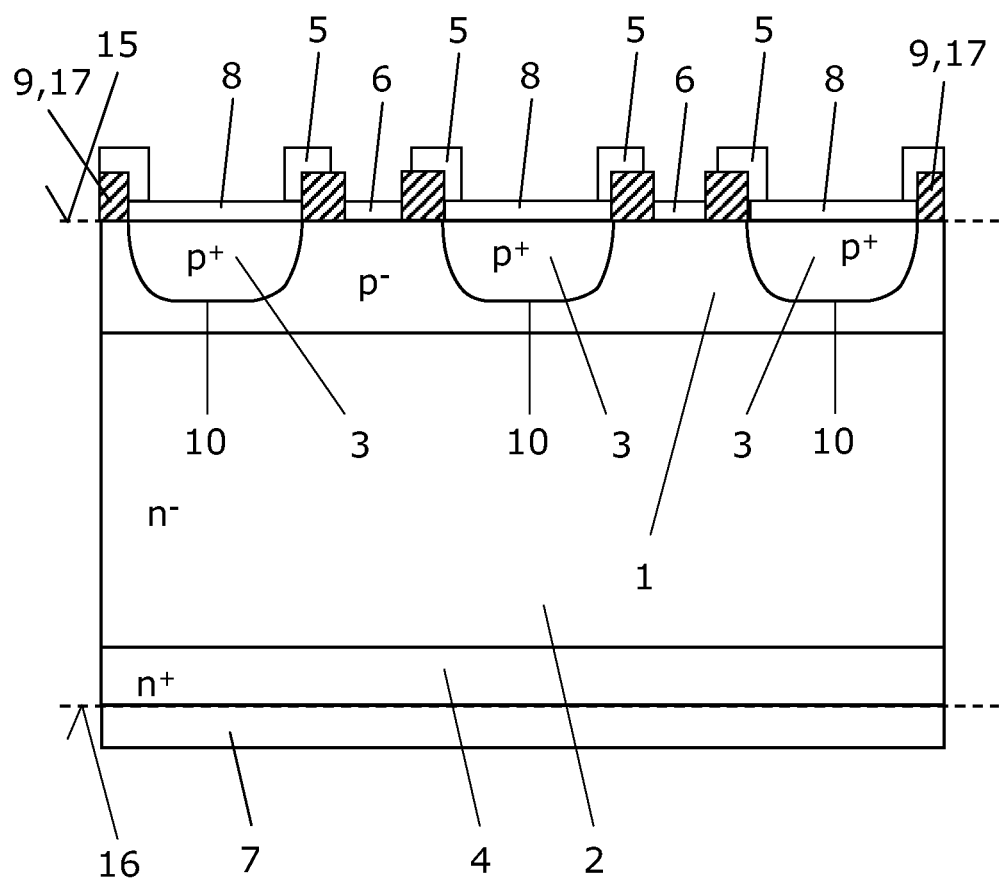

In yet a further embodiment, a further process of forming a second metallization 7 on the second surface 16 of the semiconductor device 100 is performed which results in a semiconductor device 100 as illustrated in FIG. 20. The device illustrated in FIG. 19 may be operated as a speed diode.

The processes explained with respect to FIG. 16-20 typically refer to the active area of the semiconductor device. In addition, separate conventional pn-junction termination structures for the pn-junction 11 are typically formed in a peripheral area. This may be done in parallel or partly in parallel, e.g. if the active area and the peripheral area include junction termination structures having a similar arrangement. Otherwise this process typically includes separate processes.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A bipolar semiconductor device comprising:
   a first metallization;
   a first semiconductor region of a first conductivity type comprising a first doping concentration, wherein the first semiconductor region is a contiguous semiconductor region;
   a second semiconductor region of a second conductivity type forming a pn-junction with the first semiconductor region;
   a plurality of non-contiguous third semiconductor regions of the first conductivity type at least partially arranged in the first semiconductor region, each of the plurality of third semiconductor regions forming a junction with the first semiconductor region, wherein the plurality of third semiconductor regions comprise a third doping concentration which is higher than the first doping concentration; and
   a plurality of junction termination structures;
   wherein the first semiconductor region, the second semiconductor region, and the plurality of third semiconductor regions are arranged in a semiconductor body, the semiconductor body extending to a first surface, where each of the non-contiguous third semiconductor regions are laterally separated from one another, including at the first surface, by portions of the first semiconductor region having the first conductivity type;
   wherein each of the third semiconductor regions is provided with at least one respective junction termination structure arranged at the first surface, wherein each junction termination structure vertically overlaps one of the third semiconductor regions and extends laterally beyond the outer edge of the respective third semiconductor region to overlap at least a portion of the first semiconductor region,
   wherein the bipolar semiconductor device comprises an active area and a peripheral area, wherein the plurality of third semiconductor regions and the plurality of junction termination structures are arranged in the active area, wherein the second semiconductor region does not extend to the first surface within the active area, wherein each of the plurality of third semiconductor regions vertically overlaps with the pn-junction, and wherein the first metallization is arranged on the first surface and in direct and Ohmic contact with the first semiconductor region and between and laterally adjacent to the respective junction termination structures of two adjacent ones of the plurality of third semiconductor regions.

2. The device of claim 1, wherein the semiconductor device comprises a forward current flow direction in which the pn-junction is forwardly biased, and wherein each of the junction termination structures is configured to reduce the electric field strength in the first semiconductor region close to junctions formed between the first semiconductor region and respective third semiconductor regions during at least one of commutating and switching off of the forward current.

3. The device of claim 1, wherein the junction termination structures are planar junction termination structures.

4. The device of claim 1, wherein the junction termination structures are selected from a group consisting of a field plate structure, a guard ring structure, a junction termination extension, a Variation of Lateral Doping (VLD) structure and an insulated trench extending from the first surface into the first semiconductor region.

5. The device of claim 4, wherein the field plate structure comprises, in a vertical cross-section, a stepped portion.

6. The device of claim 4, wherein the trench comprises a field plate.

7. The device of claim 1, wherein each third semiconductor region is provided with at least two junction termination structures.

8. The device of claim 1, wherein the second semiconductor region comprises a second doping concentration; further comprising: a first metallization which is arranged on the first surface and connects the first semiconductor region and the plurality of third semiconductor regions; a second surface which is opposite to the first surface; and at least one further semiconductor region of the second conductivity type arranged between the second semiconductor region and the second surface, and comprising a doping concentration which is higher than the second doping concentration.

9. The device of claim 1, wherein the semiconductor device is a power semiconductor device.

10. The device of claim 1, wherein the bipolar semiconductor device is selected from a group consisting of a diode, a thyristor and an Insulated Gate Bipolar Transistor (IGBT).

11. A speed diode device, comprising:
a first metallization;
a second metallization;
a first weakly doped semiconductor region of a first conductivity type, the first semiconductor region being in Ohmic connection and direct contact with the first metallization at a first surface of the first semiconductor region, wherein the first semiconductor region is a contiguous semiconductor region;
a second weakly doped semiconductor region of a second conductivity type, the second semiconductor region being arranged between the first semiconductor region and the second metallization and forming a pn-junction with the first semiconductor region, the pn-junction defining a forward current flow direction; and
a plurality of semiconductor wells of the first conductivity type at least partially embedded in the first semiconductor region, directly adjoining the first semiconductor region, and comprising a doping concentration which is higher than the doping concentration of the first semiconductor region, where each of the semiconductor wells are laterally separated from one another, including at the first surface, by portions of the first weakly doped semiconductor region, and wherein each of the plurality of semiconductor wells forms a junction with the first semiconductor region, and wherein the first weakly doped semiconductor region, the second weakly doped semiconductor region, and the plurality of semiconductor wells are arranged in a semiconductor body extending to the first surface, and wherein each of the plurality of semiconductor wells extends to the first surface and overlaps with the pn-junction in a projection onto the first surface; and a plurality of junction termination structures adjoining the first semiconductor region, wherein each junction termination structure vertically overlaps one of the plurality of semiconductor wells and extends laterally beyond an outer edge of the respective one of the plurality of semiconductor wells to overlap at least a portion of the first semiconductor region, wherein the speed diode device comprises an active area and a peripheral area, wherein the plurality of semiconductor wells and the plurality of junction termination structures are arranged in the active area, and wherein each of the junction termination structures is adjacent to a respective semiconductor well of the plurality of semiconductor wells, and configured to reduce the electric field strength in a boundary region of the respective semiconductor well during at least one of commutating and switching off the forward current, and wherein the first metallization is arranged on the first surface and in direct contact and Ohmic contact with the first semiconductor region and between the respective junction termination structures of two adjacent ones of the plurality of third semiconductor regions.

12. The device of claim 11, wherein each of the semiconductor wells is electrically connected to the first metallization.

13. The device of claim 11, further comprising, in a vertical cross-section, the third metallization electrically connecting the plurality of semiconductor wells.

14. The device of claim 11, wherein each of the junction termination structures comprises at least one of a field plate structure and a Variation of Lateral Doping (VLD) structure.

15. A bipolar semiconductor device, comprising:
an active area for carrying a load current and a peripheral area, the active area comprising:
a first metallization;
a first semiconductor region of a first conductivity type, the first semiconductor region being directly connected with the first metallization and comprising a first doping concentration;
a second semiconductor region of a second conductivity type, the first semiconductor region and the second semiconductor region forming a pn-junction;
a plurality of junction termination structures; and
a plurality of third semiconductor regions of the first conductivity type directly adjoining and arranged at least partially in the first semiconductor region and comprising a doping concentration which is higher than the first doping concentration, each of the plurality of third semiconductor regions forming a junction with the first semiconductor region, wherein each of the plurality of the third semiconductor regions is provided with at least one of the plurality of junction termination structures, wherein the first semiconductor region, the second semiconductor region, and the plurality of third semiconductor regions are arranged in a semiconductor body, the semiconductor body extending to a first surface, where each of the third semiconductor regions are laterally separated from one another, including at the first surface, by portions of the first semiconductor region having the first conductivity type, and wherein the second semiconductor region does not extend to the first surface within the active area;

wherein the first metallization is arranged on the first surface, wherein each of the plurality of junction termination structures is arranged in the active area and overlaps, in a projection onto the first surface, with only one of the plurality of third semiconductor regions and at least a portion of the first semiconductor region, and wherein each of the plurality of third semiconductor regions is arranged in the active area and overlaps with the pn-junction in the projection onto the first surface.

16. The device of claim 15, wherein each of the plurality of junction termination structures comprises a field plate structure.

17. The device of claim 15, wherein the peripheral area comprises pn-junction termination structures configured to broaden a space charge region of the pn-junction formed between the first semiconductor region and the second semiconductor region when the pn-junction is reversely biased.

18. The device of claim 15, wherein a shape of each of the plurality of third semiconductor regions is selected from a group consisting of a bar, a cylinder, a half-sphere and a half-ellipsoid.

19. The device of claim 16, wherein the field plate structure comprises the field plate which is electrically connected to at least one of the first metallization and one of the plurality of third semiconductor regions.

20. The device of claim 15, further comprising a second metallization in Ohmic connection with the second semiconductor region.

21. A method for forming a bipolar semiconductor device, comprising:

providing a semiconductor substrate comprising a first surface, a first semiconductor region of a first conductivity type comprising a first doping concentration and extending to the first surface, and a second semiconductor region of a second conductivity type, the first semiconductor region and the second semiconductor region forming a first pn-junction, wherein the first semiconductor region is a contiguous semiconductor region;

forming a plurality of third semiconductor regions of the first conductivity type comprising a third doping concentration which is higher than the first doping concentration such that each of the plurality of third semiconductor regions is at least partially arranged at the first surface and within the first semiconductor region, that each of the plurality of third semiconductor regions overlaps with the first pn-junction in a projection onto the first surface, that each of the plurality of third semiconductor regions forms a junction with the first semiconductor region-, and that each of the third semiconductor regions are laterally separated from one another by portions of the first semiconductor region having the first conductivity type;

forming a plurality of junction termination structures such that each one of the plurality of third semiconductor regions is provided with at least one respective junction termination structure overlapping, in a projection onto the first surface, with one of the plurality of third semiconductor regions and at least a portion of the first semiconductor region, and arranging the plurality of termination structures in an active area of the bipolar semiconductor device, wherein the second semiconductor region does not extend to the first surface within the active area, and forming a metallization in direct and Ohmic contact to the first semiconductor region and between and laterally adjacent to the respective junction termination structures of two adjacent ones of the plurality of third semiconductor regions.

22. The method of claim 21, wherein forming the plurality of junction termination structures comprises forming a plurality of field plates.

23. The method of claim 21, wherein the plurality of third semiconductor regions are formed in the active area of the semiconductor device.

24. The device of claim 1, wherein the junction termination structures are selected from a group consisting of a field plate structure and a Variation of Lateral Doping (VLD) structure.

25. The device of claim 1, wherein a shape of each of the plurality of third semiconductor regions is selected from a group consisting of a cylinder, a half-sphere and a half-ellipsoid.

26. The bipolar semiconductor device of claim 15, wherein the semiconductor body extends to a lateral boundary which is substantially perpendicular to the first surface, and wherein the peripheral area is arranged between the active area and the lateral boundary.

27. The bipolar device of claim 1, wherein the first semiconductor region is, in two cross-sections which are perpendicular to one another, a respective contiguous region.

28. The bipolar device of claim 1, wherein at least one of the third semiconductor regions comprises a central portion, and wherein an overlap of the central portion and the junction termination structures is, in the projection onto the first surface, zero.

29. The bipolar device of claim 1, wherein each of the junction termination structures is, in a cross-section perpendicular to the first surface, arranged at the periphery of the respective third semiconductor region.

30. The bipolar device of claim 11, wherein the junction termination structures are spaced apart from one another.

31. The device of claim 1, where the at least one respective junction termination structure is arranged on the first surface.

32. The device of claim 11, wherein the Ohmic connection comprises a low Ohmic resistance between the first semiconductor region and the first metallization.

* * * * *